United States Patent [19]

Love et al.

[11] Patent Number: 5,334,804

[45] Date of Patent: Aug. 2, 1994

[54] WIRE INTERCONNECT STRUCTURES FOR CONNECTING AN INTEGRATED CIRCUIT TO A SUBSTRATE

[75] Inventors: David G. Love, Pleasanton; Larry L. Moresco, San Carlos; William T. Chou, Cupertino; David A. Horine, Los Altos; Connie M. Wong, Fremont; Solomon I. Beilin, San Carlos, all of Calif.

[73] Assignee: Fujitsu Limited, Kanagawa, Japan

[21] Appl. No.: 977,571

[22] Filed: Nov. 17, 1992

[51] Int. Cl.$^5$ ............................................. H05K 01/00
[52] U.S. Cl. ..................... 174/267; 174/257; 174/260; 361/760; 361/784
[58] Field of Search ............... 174/256, 257, 259, 260, 174/262, 263, 264, 265, 266, 267; 361/400, 403, 412, 414; 228/179, 180, 180.1

[56] References Cited

U.S. PATENT DOCUMENTS

| | | | |
|---|---|---|---|
| 3,726,002 | 4/1973 | Greenstein et al. | 174/264 |
| 3,871,015 | 3/1975 | Lin et al. | 357/67 |
| 3,980,917 | 9/1976 | Kakizaki et al. | |
| 4,067,104 | 1/1978 | Tracy | 29/626 |
| 4,418,857 | 12/1983 | Ainslie et al. | 228/180 |
| 4,545,610 | 10/1985 | Lakritz et al. | |
| 4,547,834 | 10/1985 | Dumont et al. | 361/386 |
| 4,606,962 | 8/1986 | Reylek et al. | 428/148 |
| 4,646,050 | 2/1987 | Kling et al. | |
| 4,664,309 | 5/1987 | Allen et al. | 228/180.2 |
| 4,705,205 | 11/1987 | Allen et al. | 228/180.2 |
| 4,783,722 | 11/1988 | Osaki et al. | 361/411 |
| 4,835,344 | 5/1989 | Iyogi et al. | |
| 4,954,878 | 9/1990 | Fox et al. | 357/81 |
| 5,014,111 | 5/1991 | Tsuda et al. | 357/68 |
| 5,046,954 | 9/1991 | Schmedding | |
| 5,054,192 | 10/1991 | Cray et al. | 29/835 |
| 5,074,947 | 12/1991 | Estes et al. | 156/307.3 |

FOREIGN PATENT DOCUMENTS

| | | | |
|---|---|---|---|
| 0327399A1 | 8/1989 | European Pat. Off. | H01L 23/50 |
| 0329314A1 | 8/1989 | European Pat. Off. | H01L 23/50 |

*Primary Examiner*—Leo P. Picard
*Assistant Examiner*—Cheryl R. Figlin
*Attorney, Agent, or Firm*—McCubbrey, Bartels & Ward

[57] ABSTRACT

An interconnect structure for connecting an integrated circuit (IC) chip to a supporting substrate is described. The supporting substrate serves to communicate signals between the IC chip and the "outside world," such as other IC chips. In one embodiment, the interconnect structure comprises an interconnect substrate having a first post disposed on one of its surfaces and a second post disposed on another of its surfaces. One post is for contacting the IC chip and the other is for contacting the major substrate. Each post comprises an elongated body having top and bottom ends, with the bottom end being mounted to one of the substrate surfaces and the top end having a substantially flat surface which is substantially co-planer with the substrate surface. The interconnect substrate further comprises a device for de-concentrating the mechanical stain present at one or both of the top and bottom ends of each post. The first and second posts are electrically coupled to one anther so that an electrical signal may pass from IC chip to the supporting substrate, and vice-versa.

25 Claims, 13 Drawing Sheets

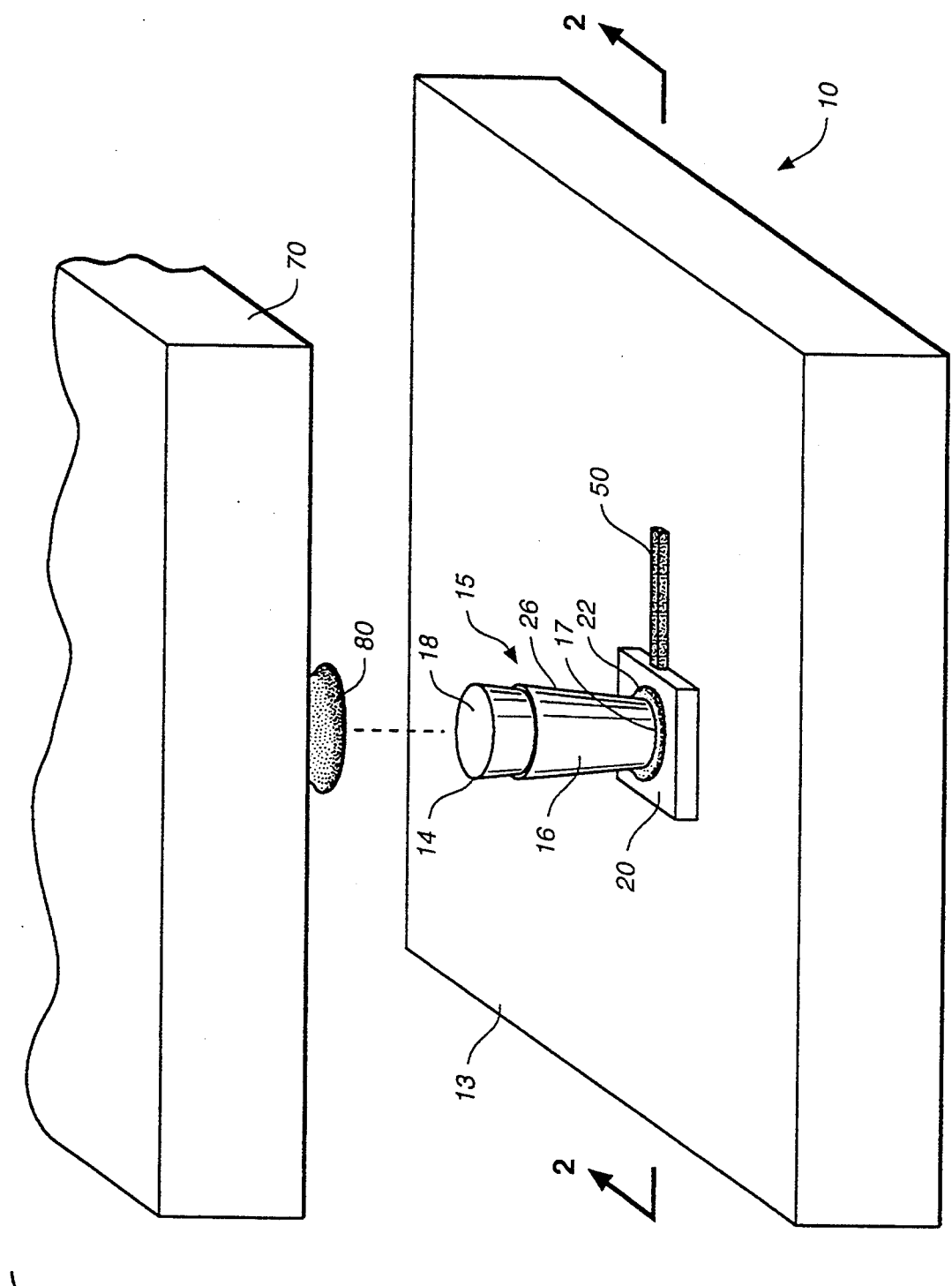
FIG._1

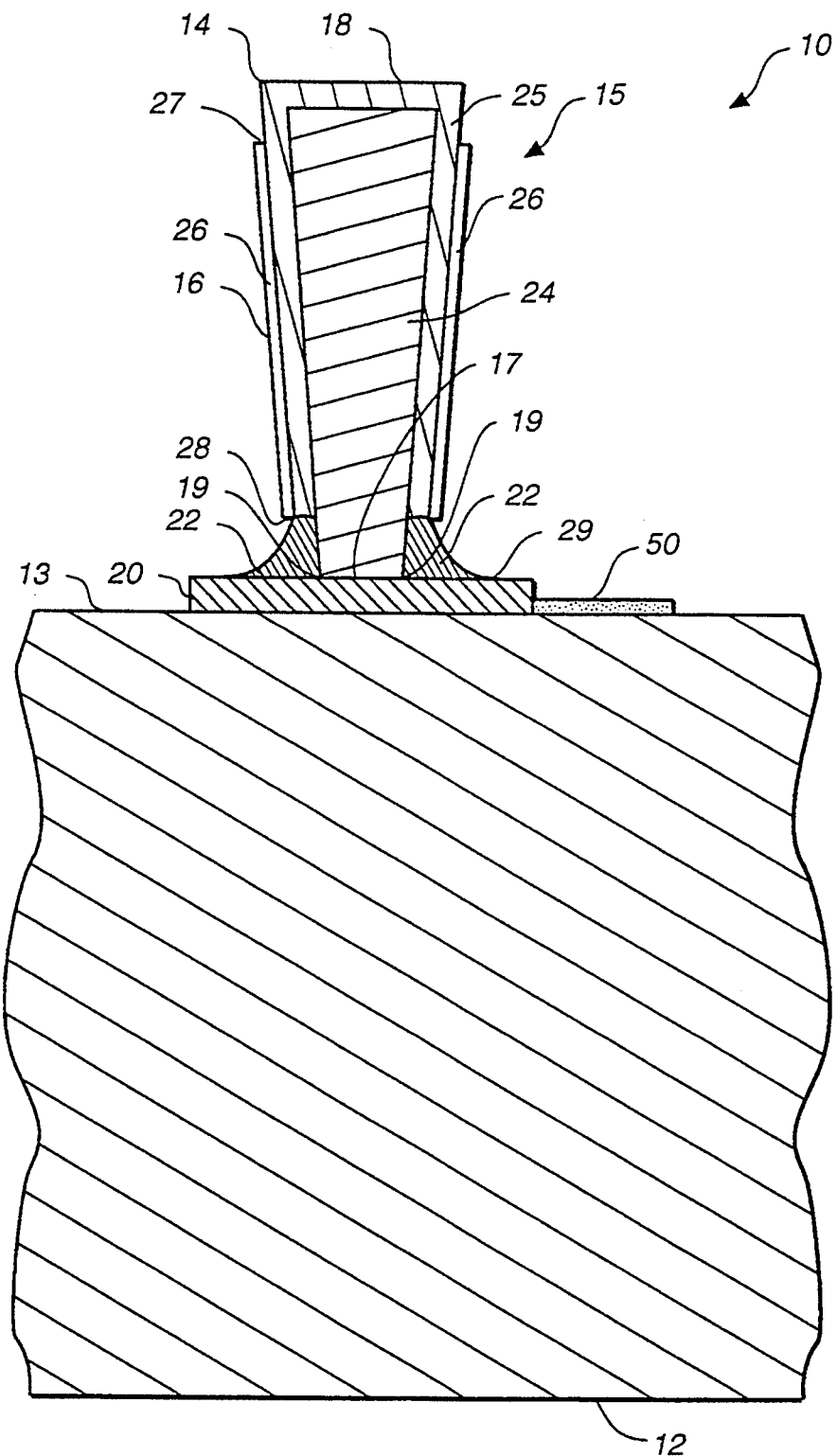
FIG._2

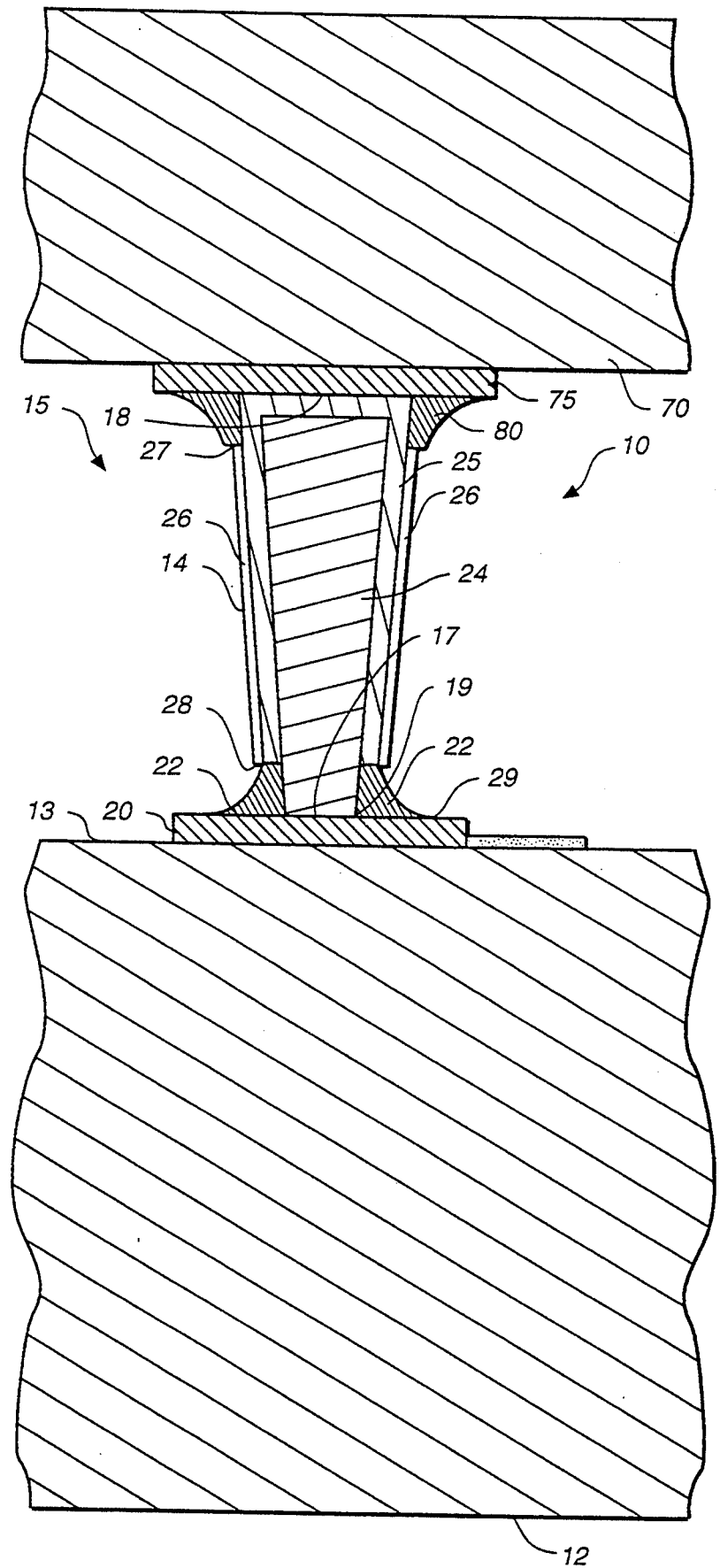
FIG._3

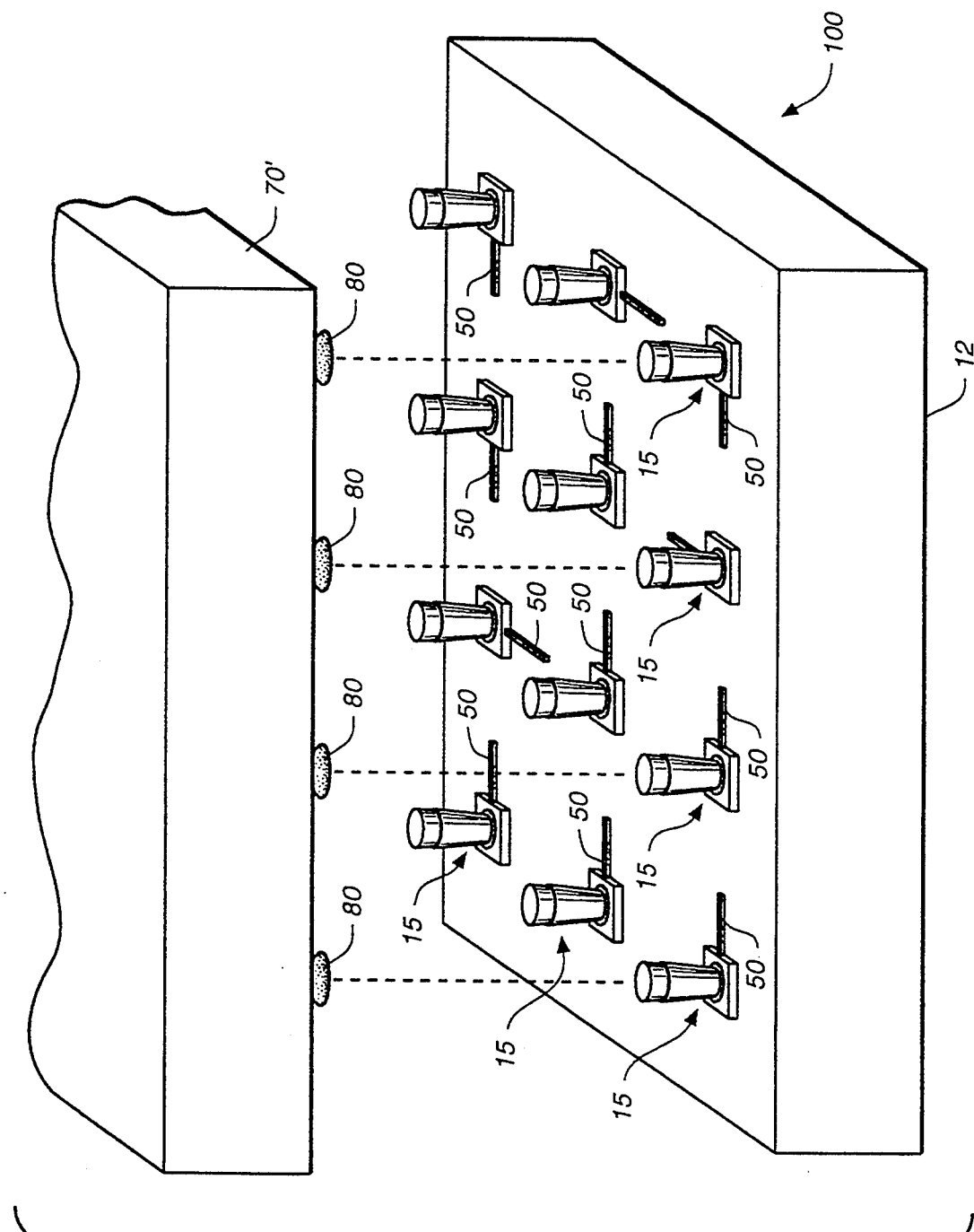
FIG._4

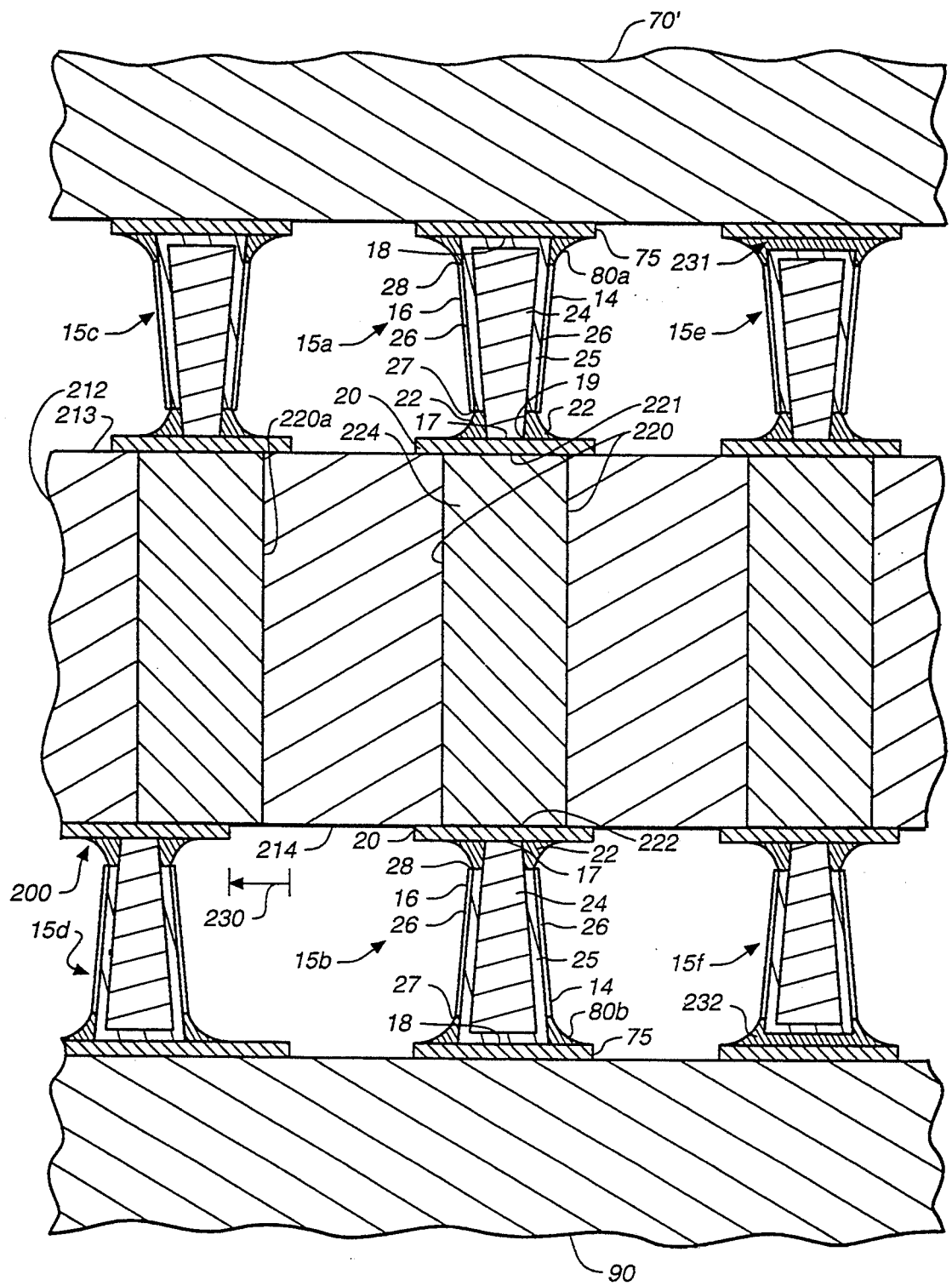
FIG._5

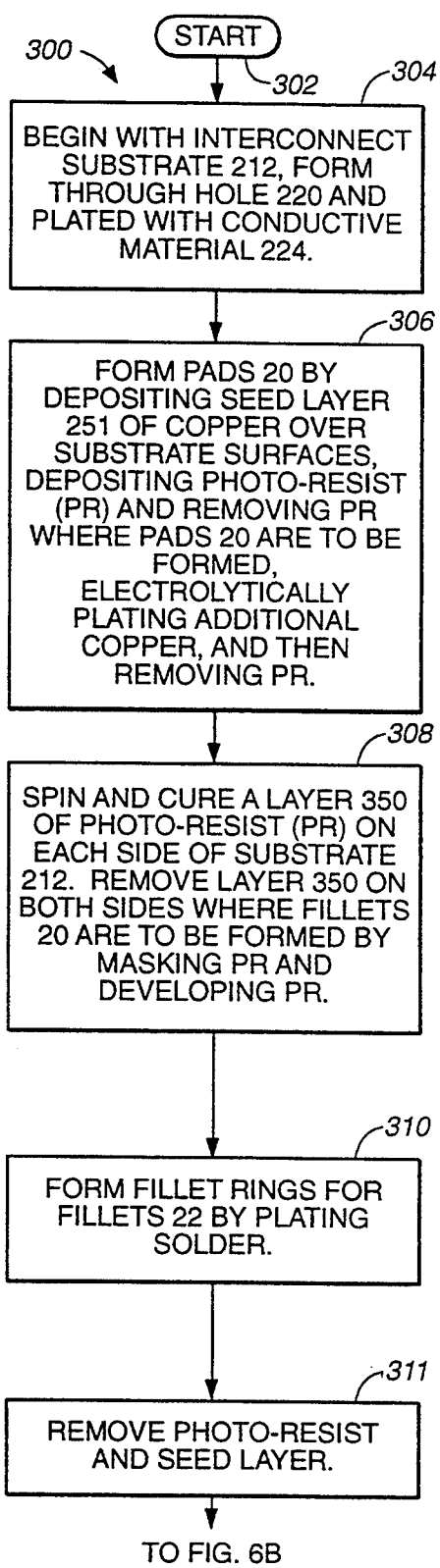
FIG._6A
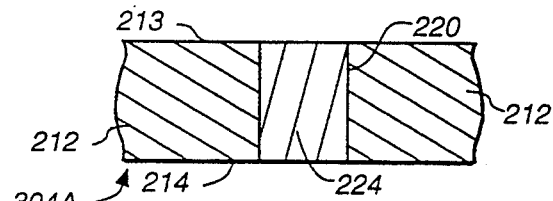
FIG._6A-1
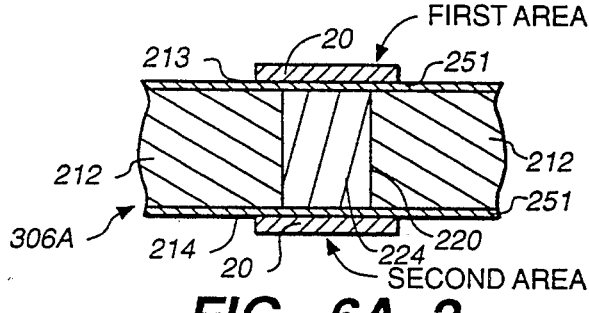
FIG._6A-2
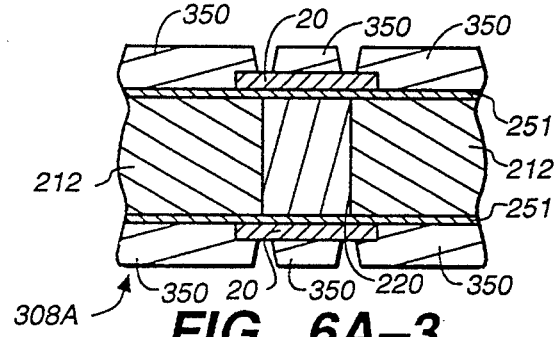
FIG._6A-3
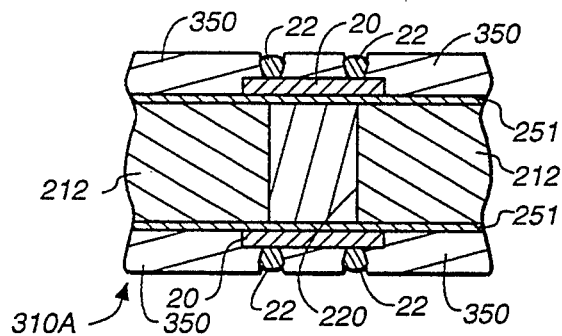
FIG._6A-4
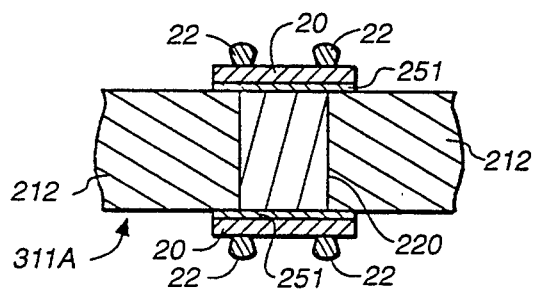
FIG._6A-5

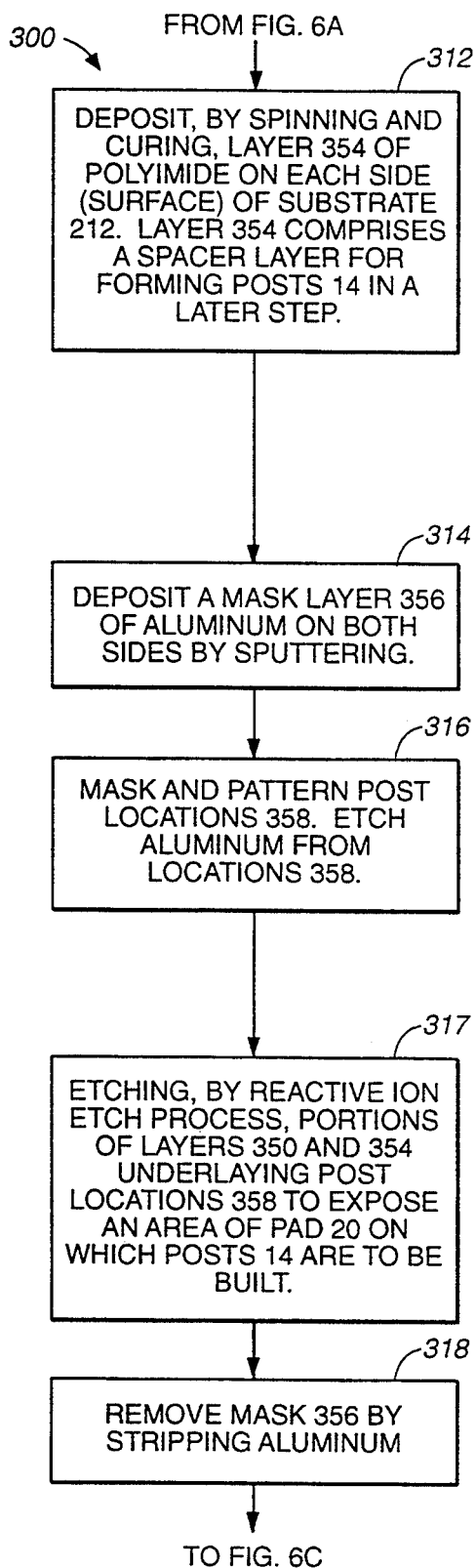
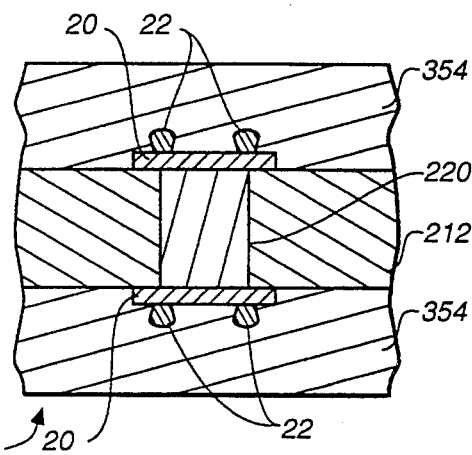
FIG._6B-1
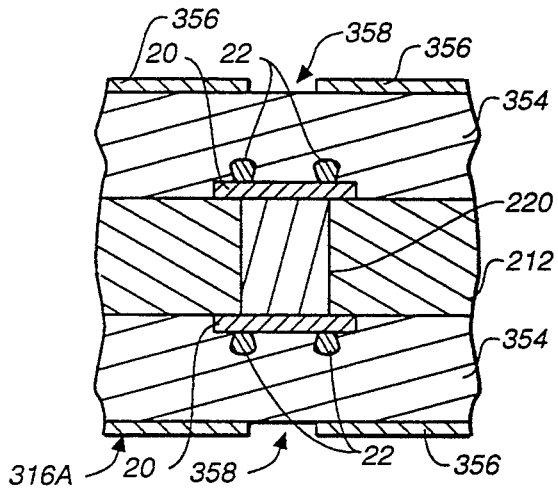
FIG._6B-2
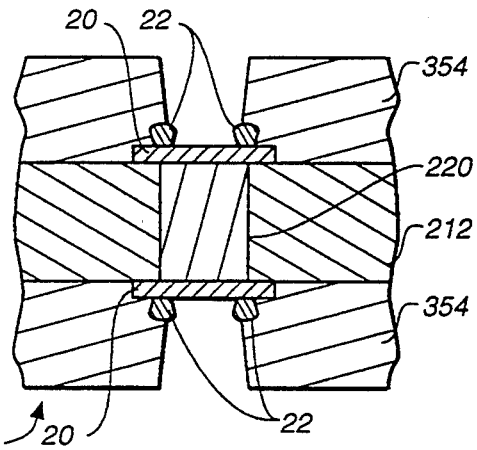
FIG._6B-3
FIG._6B

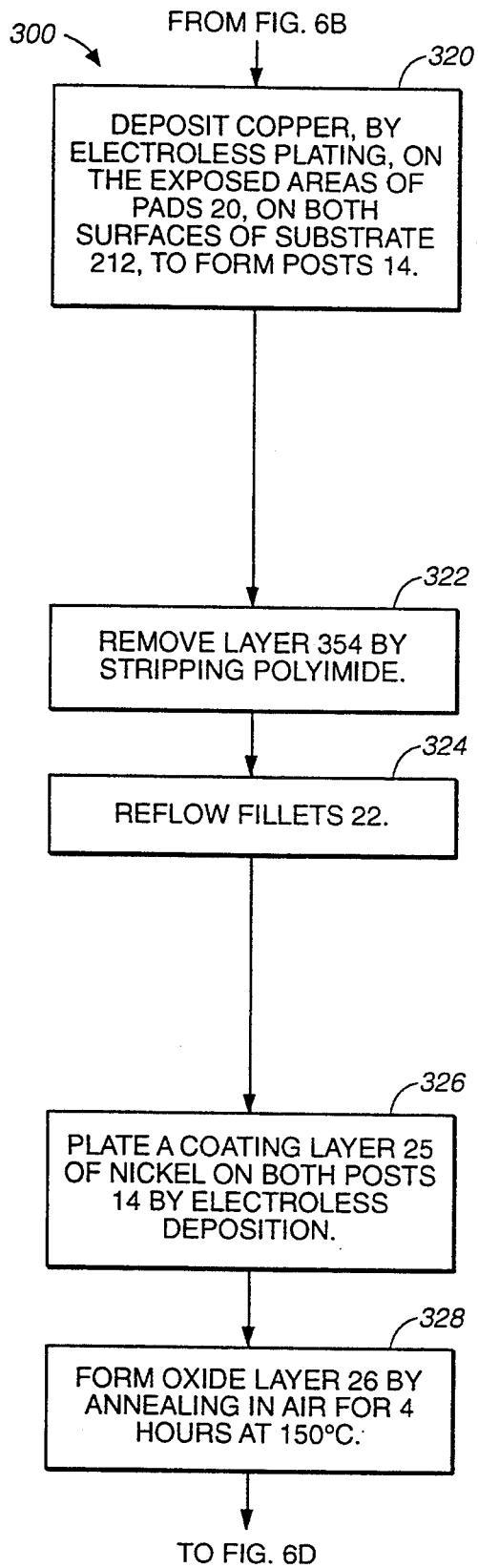
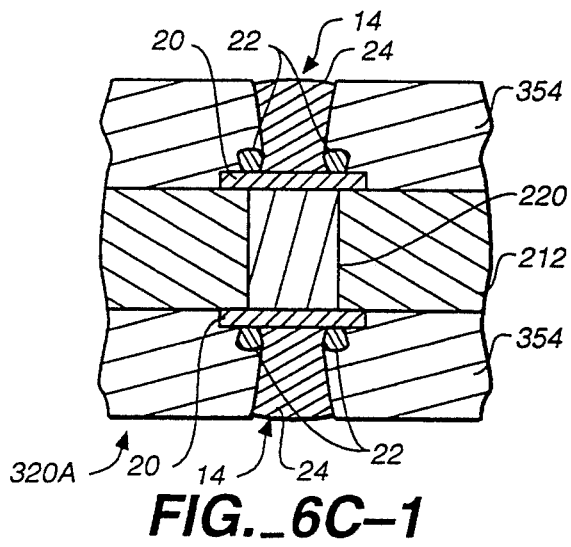
FIG._6C-1
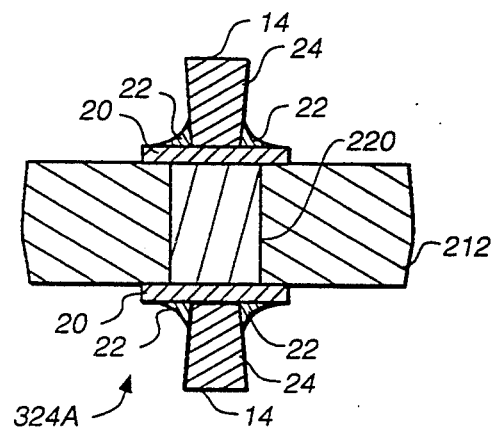
FIG._6C-2
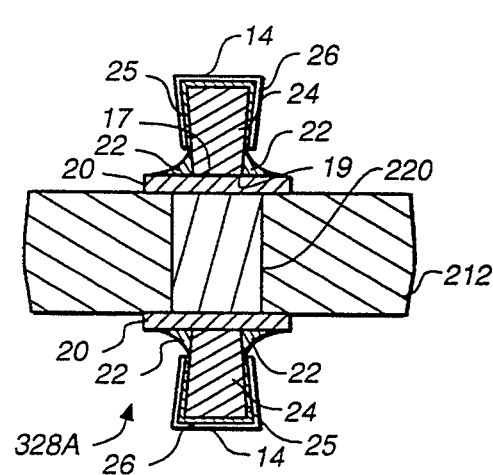
FIG._6C-3
FIG._6C

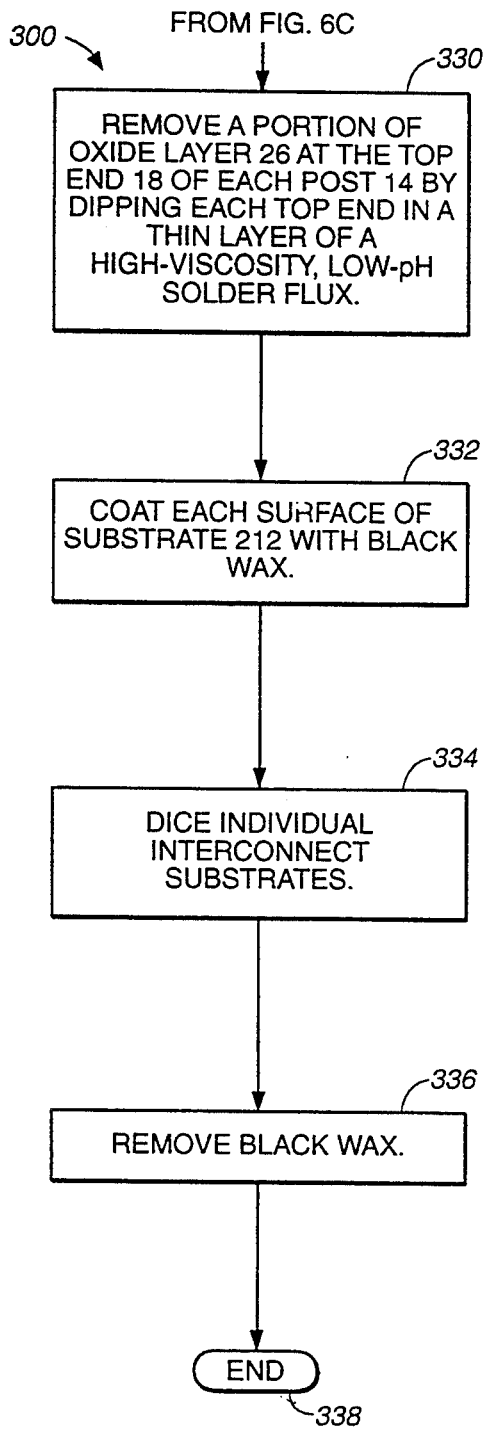
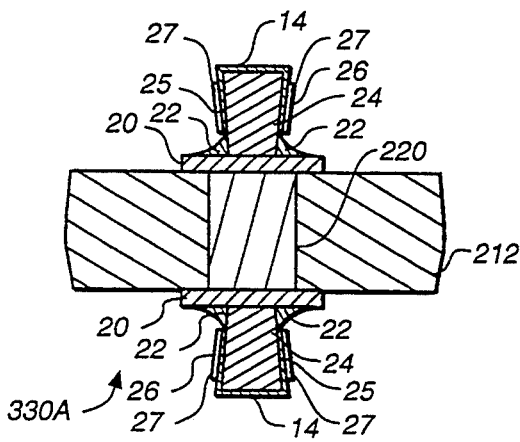
FIG._6D-1
FIG._6D

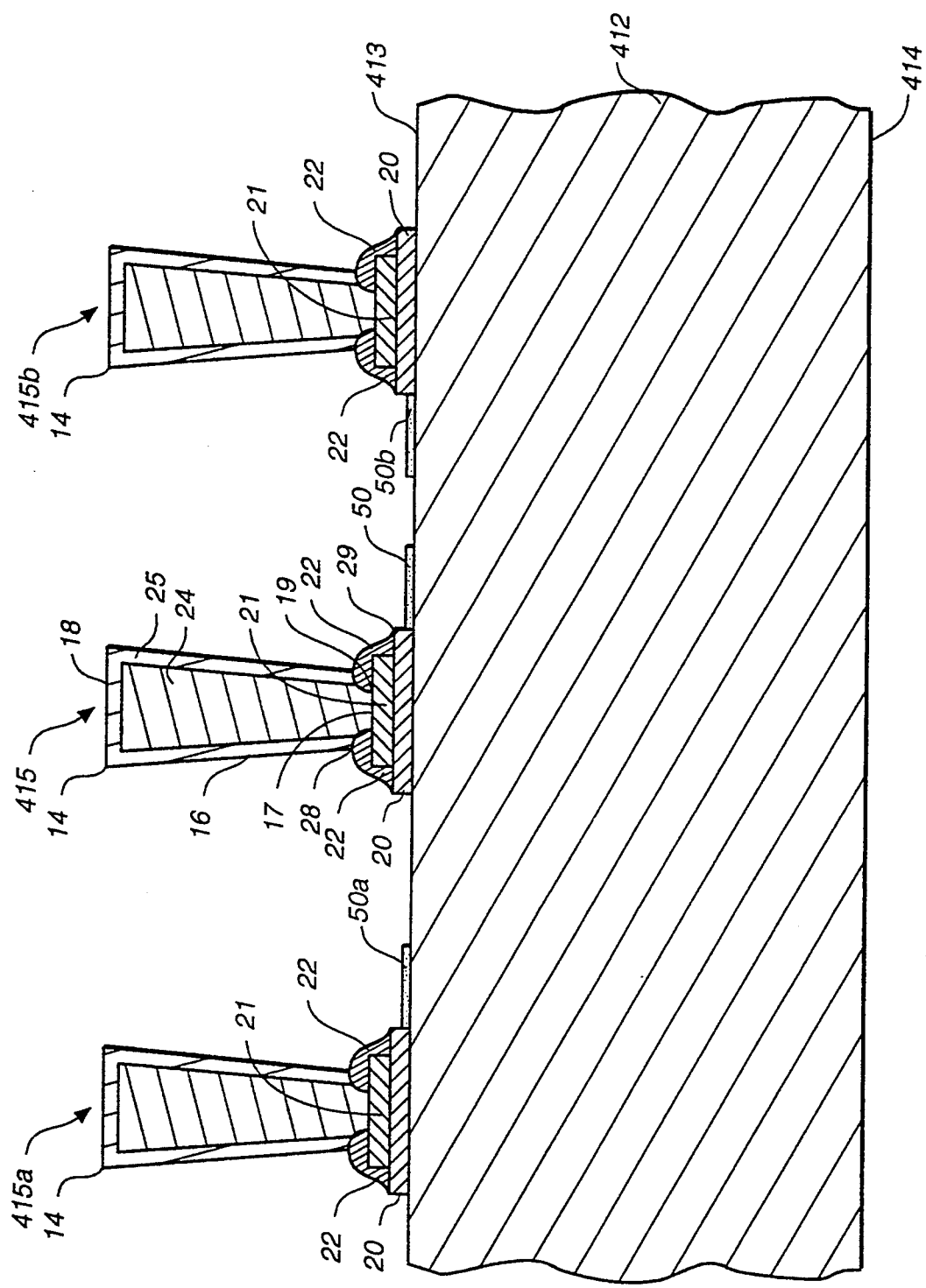
FIG._7

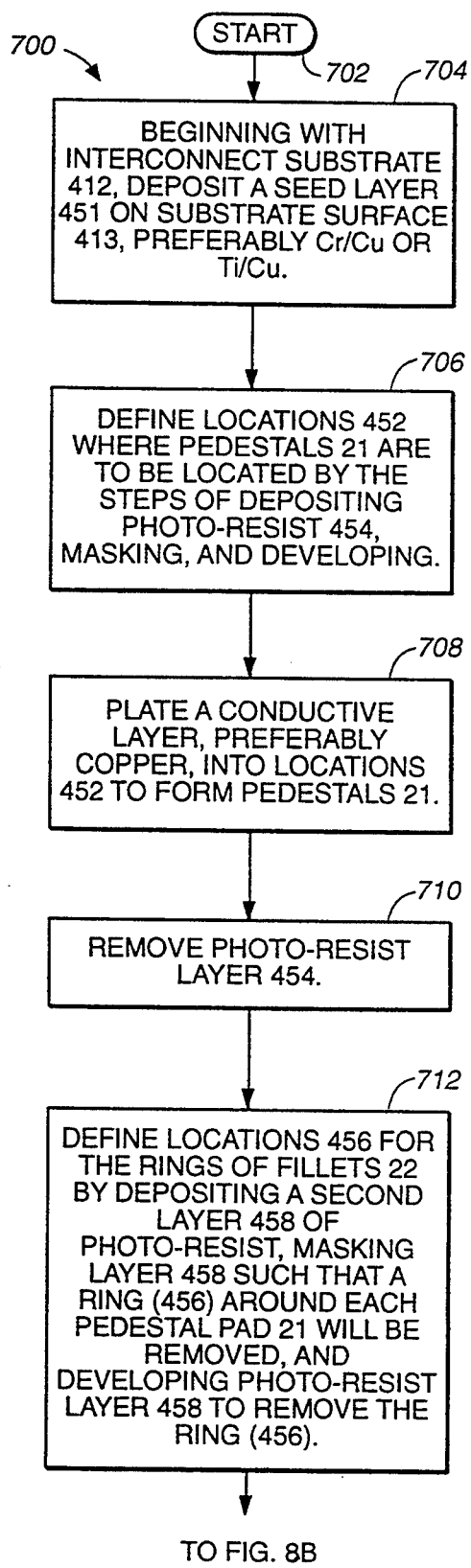
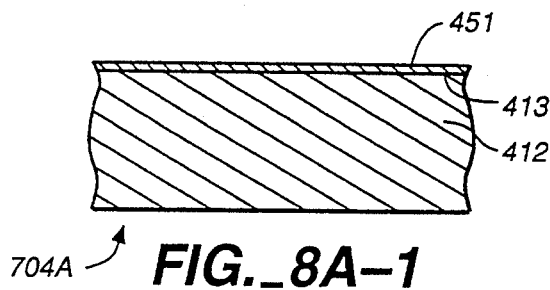
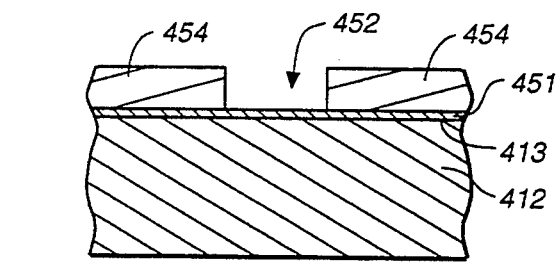
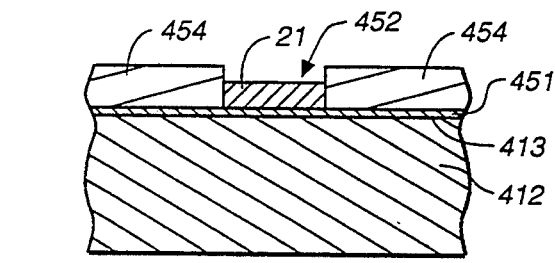
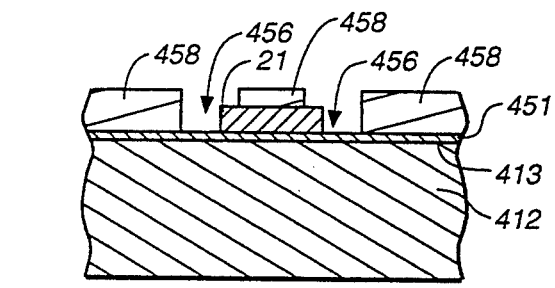
FIG._8A-1
FIG._8A-2
FIG._8A-3
FIG._8A-4
FIG._8A

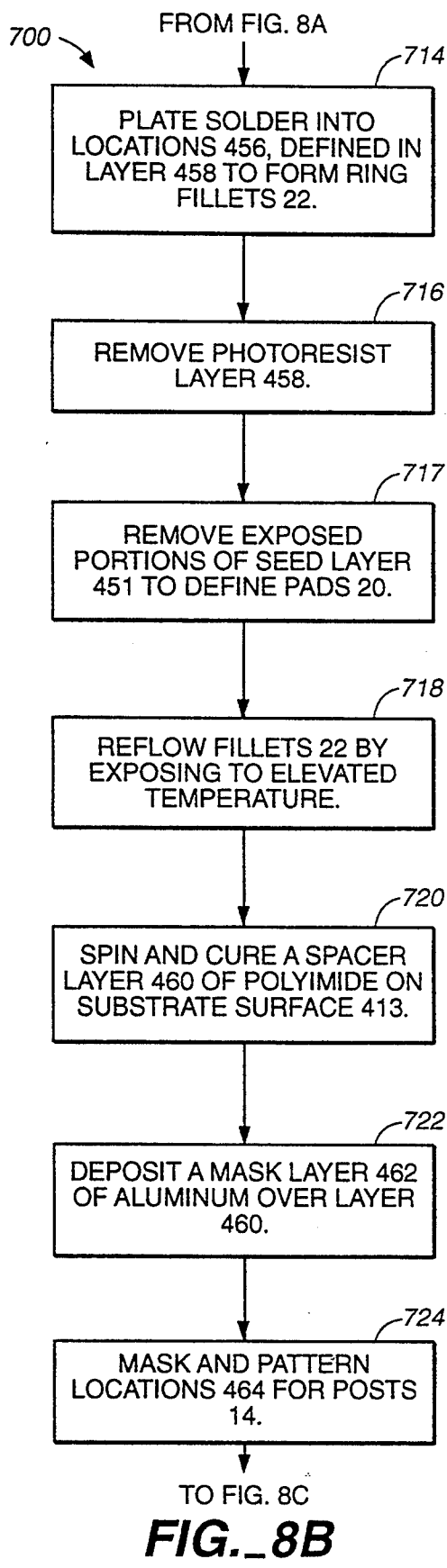
FIG._8B
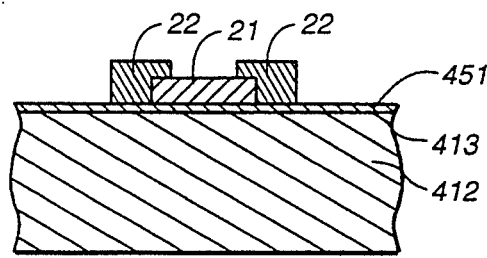
FIG._8B-1
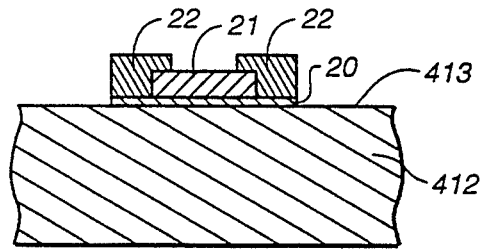
FIG._8B-2
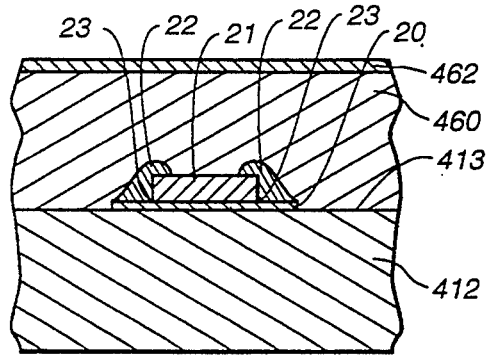
FIG._8B-3
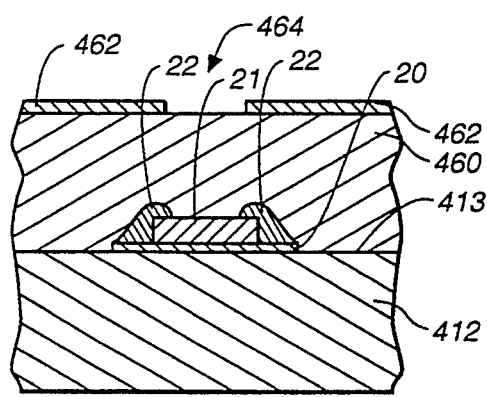
FIG._8B-4

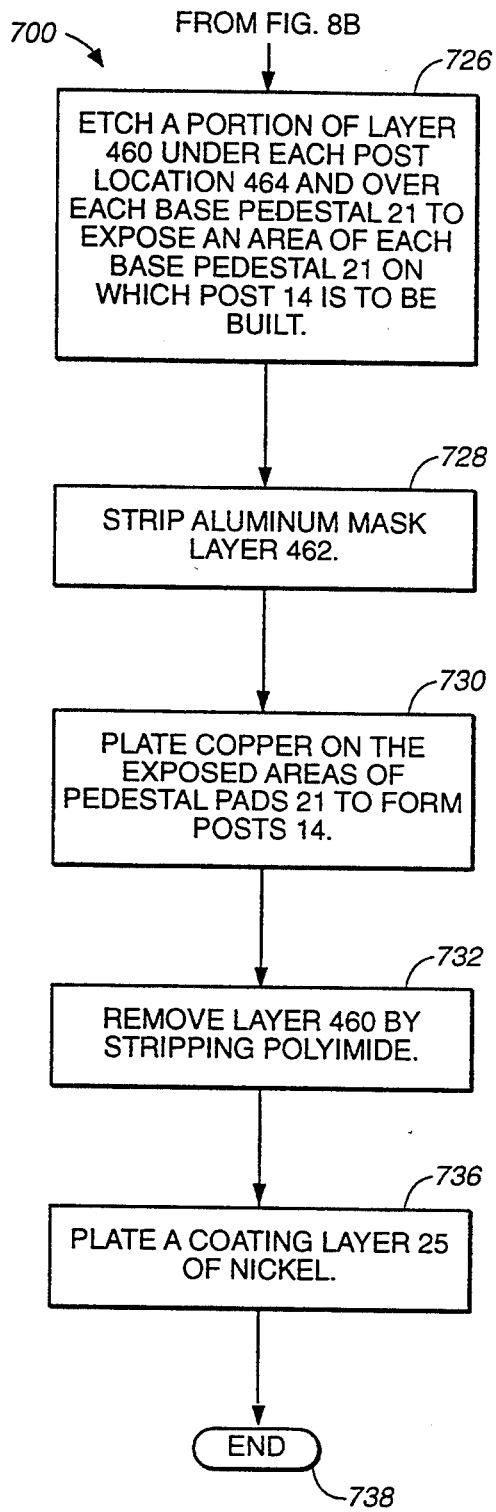
FIG._8C
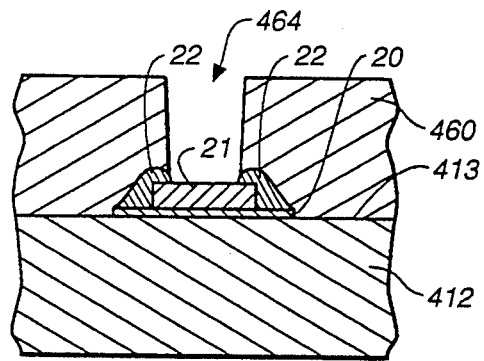
FIG._8C-1
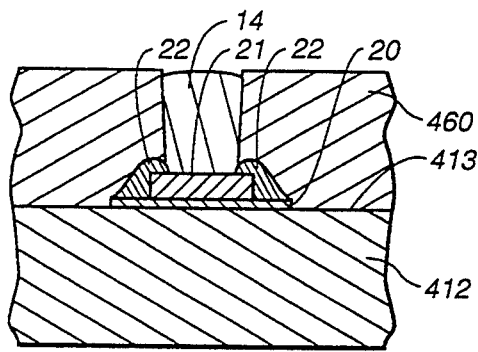
FIG._8C-2
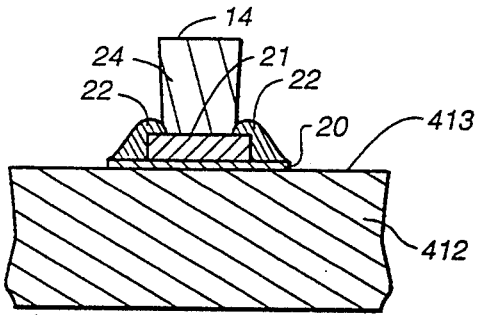
FIG._8C-3
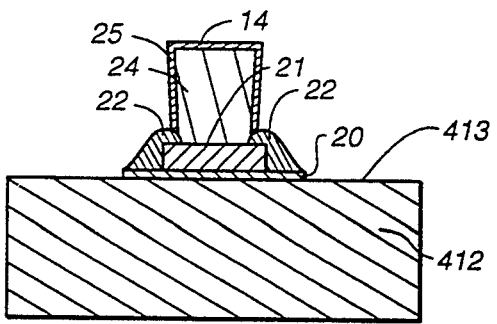
FIG._8C-4

WIRE INTERCONNECT STRUCTURES FOR CONNECTING AN INTEGRATED CIRCUIT TO A SUBSTRATE

FIELD OF THE INVENTION

The present invention relates to interconnect structures for electrically and mechanically connoting an integrated circuit (IC) chip to a supplying substrate, which serve to communicate signals between the IC chip and the "outside world," which may be other IC chips or other external devices, and to supply power to the IC chip. Additionally, the present invention relates to methods for constructing such interconnect structures.

BACKGROUND OF THE INVENTION

Various means of electrically and mechanically connecting, or coupling, an integrated circuit to a supporting substrate, or major substrate, are known. A common means used for this purpose are solder bumps disposed on the IC chip and the supporting substrate in a corresponding relationship such that their surfaces are parallel. An example of this is the Controlled Collapsed Chip Connection process, which is abbreviated as the "C4" or "C$^4$" process. The chip may be mounted to the supporting substrate such that the active surface of the chip, i.e., the structure which has the integrated components, faces away from the substrate or faces towards the substrate ("flip-chip"). In the first case, the signal and power lines from the active surface of the chip are brought to the periphery of the chip, and then connected to the supporting substrate by wirebonds or TAB circuits. In the latter case of a "flip-chip" orientation, conductive pads on the active surface of the IC chip contact solder bumps on the supporting substrate. Flip-chip bonding generally permits a greater quantity of interconnects per chip than other bonding approaches. The IC chip is bonded to the supporting substrate and held together by the fusing of corresponding solder bumps. The dimensions of such a solder bump are typically 3.2 mils (80 microns) high and 5 mils (125 microns) in diameter. In bonding, two opposing solder bumps are brought into registration and fused together to form a single solder bump spanning between the IC chip and the major substrate. The aspect ratio of the fused solder bump, i.e., the height of the structure divided by its width (diameter), is low, ranging between 1 and 2.

Each of the solder-bump connections must be able to withstand the mechanical sheafing stresses that are developed by temperature fluctuations and the difference in thermal expansion coefficients between the IC chip and the supporting substrate during operation of the IC chip. Specifically, when the IC chip and the supporting substrate are exposed to elevated temperatures, they will expand at different rates and to different dimensions, thereby inducing mechanical stresses in the solder bump connections. After many thermal cycles and/or large changes in temperature, the fused solder bumps will begin to fatigue and develop cracks. This lowers or destroys the electrical conductivity of the fused solder bumps. The cracking usually occurs at the corners of the bases, or ends, of the fused solder bump. The cracking is exacerbated by the low fatigue resistance of solders typically used in IC manufacturing and the low aspect ratio of the fused solder bumps. With regard to the latter aspect, the rigidity of the fused solder bumps increases as the aspect ratio decreases, thereby lowering the amount of distance the midsection of the fused bumps may flex in order to absorb the applied stresses.

To reduce the thermal stresses, the IC chip and supporting substrate are often constructed from materials having closely matched expansion coefficients so that they expand to substantially the same dimensions when exposed to an elevated temperature. However, thermal stresses are still generated each time the IC chip is "powered-up." When the chip is "turned on," a large transient temperature difference between the IC chip and the supporting substrate develops until the temperature of the supporting substrate reaches a temperature near that of the IC chip. Thus, with the high temperatures and power cycling common for high performance computer chips, solder bumps crack and become mechanically and electrically unreliable even when the IC chip and the supporting substrate have closely matched thermal expansion coefficients. This will become a greater problem in the future as computers are designed to dissipate more power in smaller volumes, thereby leading to greater thermal stresses.

One approach to addressing the fatigue problems of fused solder bumps is the Bonded Interconnect Process (BIP). The BIP process uses a gold (Au) bonding material, which is less easily fatigued, and provides a structure which has a larger aspect ratio, typically 4–8. (The aspect ratio is generally defined as the height divided by the width of the structure.) To form one BIP connection, a gold ball is formed on a pad of the IC chip, with a gold pin-like structure extending outward from the top of the gold ball. The gold ball and pin-like structure are formed in the same process by a thermal compression bonder, which has a hollow tip end. To form the ball and pin, the tip of the thermal compression bonder is placed in contact with the IC chip pad, the gold ball is smashed onto the pad to form the bond and the bonder tip is retracted from the surface to expose the wire, which is then cut to the desired length. The gold pin is brought in contact with a molten solder bump on a supporting substrate to form the BIP interconnect. At this point, the solder is flowed around the gold to form a solid mechanical connection. Generally, the gold ball and pin are intended to remain solid, i.e., to not fuse with, or melt into, the solder bump. The gold pin acts as a "stand-off" spacer between the IC chip and the supporting substrate, thereby increasing the aspect ratio of the BIP interconnect. However, under some conditions, the gold can dissolve into or react with the solder, which would weaken the holding capability of the solder. Gold-tin intermetallic compounds will also embrittle the joint.

Although the BIP process increases the reliability of the interconnect by having a higher aspect ratio and using gold at one end of the interconnect, the BIP process has a number of drawbacks which limit its use for IC chips having a large number of interconnects to the supporting substrate. First, the BIP process is an "invasive" process since the tip end of the compression bonder makes contact with, and actually compresses against, the IC chip. This places a substantial mechanical force against the IC chip which can destroy any active circuitry, such as transistors, underlying the pad on which the tip end makes contact. (The pad is large enough that the pad itself is not destroyed.) For low density integrated circuits (e.g., LSI), the active circuitry can be arranged such that the I/O pads do not overlay any active circuitry. However, for high density integrated circuits (e.g., VLSI and ULSI) used in high performance computers, I/O pads often overlay active circuitry. In some applications, the gold balls and pins are compressed onto the supporting substrate. Oftentimes, the supporting substrate also has circuitry which can be damaged by the thermo-compression bonder.

As a second disadvantage, the number of interconnects required for a high density device is large so that the number of BIP bonds required is similarly large. Each time a bond is made, i.e., the compression bonder contacts and compresses the chip, there is a risk of damage or fatigue. This risk multiplies with the number of bonds, thus reducing the yield of the BIP process. In view of the above two disadvantages, the BIP process in its currently used form is not compatible with many high-density IC chips. Further to this point, it is expected that the number of I/O pads per chip will continue to increase.

As a third disadvantage of the BIP process, the maximum number of BIP gold balls that can be formed currently is approximately 3 per second. With the current number of average I/O pads for typical ULSI circuits now approaching 500, it will take one thermo-compression bonder approximately 3 minutes to prepare one IC chip for bonding to the supporting substrate. In the future, it is expected that computer-system requirements will increase the number of I/O pads to well over 1000. This would increase the BIP preparation time to well over 5 minutes per single IC chip. Additionally, the number of IC chips requiting BIP connections for a high performance computer system is expected to grow from approximately 100 to well over 1000. These future trends raise concerns as to whether the BIP process can still be commercially feasible for manufacturing high performance computer systems.

As a fourth disadvantage of the BIP process, the gold can dissolve into the solder during the heat contacting process, which can significantly weaken the holding capability of the solder due to the formation of intermetallic compounds. The weakening reduces the reliability of the BIP interconnects and the reliability of systems using large numbers of BIP interconnects.

Another approach to addressing the fatigue problem of fused solder bumps is the UNIAX TM contact system. The UNIAX contact system is directed towards addressing the above-described disadvantages of the BIP process. In the UNIAX system, a plurality of cylindrical interconnect pins are held in a sheet of polymer film. Each interconnect pin is placed in a hole in the film such that its axial direction is held perpendicular to the film surface. The film is almost as thick as the axial length of the pin (100–200 microns). Each film hole holds its corresponding pin at the middle of its axial length such that a small and equal amount of the pin protrudes from either surface of the film. To interconnect the IC chip with the supporting substrate, the film is interposed between the chip and substrate, and the chip and substrate are lightly pressed together. The UNIAX pins are aligned to corresponding pads on both the chip and the substrate, and solder is used to mechanically couple the pins to the chip and substrate. Before contacting, the solder is deposited on each of the substrate and chip by any of the following means: evaporation through a shadow mask; defining a mask with photo-lithography followed by electroplating; metal lift-off; or stenciling or silkscreening a solder paste.

Although the UNIAX system has been successful at addressing some of the disadvantages of the $C^4$ and BIP processes and, in theory, can provide a large number of interconnects, it also has drawbacks which limit its use for large numbers of interconnects. The aspect ratio of the UNIAX pins is on the order of 1 to 2. This creates a very stiff connection that will not flex under normal operating conditions. Any mismatch in thermal strain will put the UNIAX pin under stresses capable of causing the bond to fail. There is a tendency for the polymer film to limit the flexing of the UNIAX posts during thermal expansion and contraction. As a result, the mechanical sheer induced by thermal cycling are transferred to the solder joints at either end of each UNIAX pin, rather than being distributed along the axial direction of the pins. As a result, the UNIAX system may exhibit a reliability no better than that of the $C^4$ solder bump process. A solderless pressure joint is possible with the UNIAX pin. The resistance of this type of contact is, however, unacceptably high in some cases.

In addition to these disadvantages, the $C^4$, BIP, and UNIAX interconnect systems require large bonding pad areas on the IC chip and/or the substrate, usually 100 $\mu$m or more on a side or 100 $\mu$m or more in diameter. The large pad areas not only limit the number of interconnects that can be made to the chip and substrate but increase the parasitic capacitance of the interconnect. As is known in the semiconductor art and circuit board art, the amount of parasitic capacitance of a pad is proportionally related to its area, and the speed at which the interconnect can transmit electrical signals decreases with increasing parasitic capacitance. The current trends in high performance computer systems are towards increasing the density of chip interconnects and speed of electrical communications. These trends raise concerns as to whether the $C^4$, BIP, and UNIAX approaches can still be used for manufacturing high performance computer systems.

Presently, there is a need for a high density, high speed interconnect structure whose characteristics match or exceed the non-invasive bonding of fused solder bumps and the higher mechanical and electrical reliability of BIP, and which can be easily manufactured with low parasitic capacitance, such that several hundred to several thousand interconnects can be made from a one centimeter square chip to a supporting substrate. The present invention is directed to filling this need.

SUMMARY OF THE INVENTION

The present invention recognizes that these problems experienced in the prior art may be addressed by an interconnect structure having a substrate with a plurality of electrically conductive posts mechanically mounted vertically to the surface of the supporting substrate. The present invention further recognizes that the effects of thermal mechanical stress may be reduced by having a large aspect ratio for each post and by having means disposed at one or both ends of each post for de-concentrating the mechanical stress and strain developed along the body of the post. The present invention further recognizes that the substrate may be the supporting substrate or may be an intermediate substrate which is interposed between the IC chip and a major supporting substrate. In the latter case, electrically conductive posts are disposed on both surfaces of the intermediate interposer substrate. Additionally, the present invention recognizes that such a structure is more reliable than the C[4] and UNIAX processes and has the potential of being mass produced at costs lower than those associated with the BIP process.

Broadly stated, the present invention encompasses a wire interconnect structure for electrically coupling a substrate to an integrated circuit chip and methods for constructing the wire interconnect structure. The wire interconnect structure of the present invention comprises an electrically conductive post disposed on a surface of the substrate for making contact to the integrated circuit. The post comprises an elongated body having a bottom end and top end thereof, the bottom end being mounted on the surface of the substrate. The wire interconnect structure further comprises means at either or both of the bottom and top ends for de-concentrating the mechanical stress developed along the body of the post.

In one embodiment of the present invention, the top end of the post has a substantially flat surface which is substantially co-planer with the surface of the substrate. In another embodiment of the present invention, the stress deconcentration means reduces the mechanical stress present at the bottom end of the post and comprises a solder fillet disposed along the peripheral edge formed around the bottom end of the post next to the substrate surface. In another embodiment of the present invention, the stress de-concentration means reduces the mechanical stress present at the top end of the post, where it couples to the IC chip, and preferably comprises means disposed near the top end of the post for limiting the flow of solder from the opposing solder bump of the IC chip. This aids in preventing the solder bump from coating the post, which would decrease the aspect ratio of the post and increase the thermally-induced mechanical stresses. In a further embodiment of the present invention, the body of the post comprises a tapered shape with the bottom end being smaller than the top end, which aids in aligning the post to the IC chip and, in combination with solder fillets disposed at the bottom end, de-concentrates stress at the ends of the post.

Additionally, the present invention encompasses methods for making these embodiments of the wire interconnect structure according to the present invention.

Accordingly, it is an object of the present invention to provide an electrical interconnect between an integrated circuit chip and a supporting substrate which has low capacitance, high mechanical strength, high resistance to thermally induced strain, and high reliability.

It is another object of the present invention to provide an array of interconnects between an integrated circuit chip and a supporting substrate having a high interconnect density.

It is still another object of the present invention to provide an array of wire interconnects which may be coupled to the integrated circuit chip without invasive bonding techniques and with a minimal possibility of damaging the integrated circuit chip.

It is yet another object of the present invention to provide an array of interconnects disposed on a supporting substrate or interposer substrate which may be manufactured at the same time other such arrays are manufactured, thereby lowering the bulk manufacturing costs and raising the bulk manufacturing volume.

It is still another object of the present invention to provide an interconnect structure between an integrated circuit chip and a supporting substrate which aids in the alignment of the chip to the substrate.

It is yet another object of the present invention to increase the manufacturing yields of interconnect structures according to the present invention by providing interconnect structures which are self-aligned to opposing solder bumps during soldering operations by the surface energy of the molten solder bumps.

These and other objects of the present invention will become apparent to those skilled in the art from the following detailed description of the invention, the accompanying drawings, and the appended claims.

BRIEF DESCRIPTION OF THE DRAWINGS

FIG. 1 is an isometric view of a first embodiment of the wire interconnect structure according to the present invention.

FIG. 2 is a cross-sectional view of the wire interconnect structure of FIG. 1 taken along a vertical plane passing through the line 2—2 shown in FIG. 1.

FIG. 3 is a cross-sectional view of the wire interconnect structure of FIG. 1 taken along a vertical plane passing through the line 2—2 shown in FIG. 1 and showing the contact of an integrated circuit chip to the wire interconnect structure of FIG. 1.

FIG. 4 is an isometric view of an array of the wire interconnect structure shown in FIGS. 1 and 2.

FIG. 5 is a cross-sectional view of a second embodiment of the wire interconnect structure according to the present invention.

FIGS. 6A–6D are a flow diagram of a method of constructing the first and second embodiments of the present invention.

FIGS. 6A-1 through 6A-5, FIGS. 6B-1 through 6B-3, FIGS. 6C-1 through 6C-3, and FIG. 6D-1 collectively show a sequence of cross-sectional views of two interconnect structures according to the present invention at various stages of construction according to the flow diagram shown in FIGS. 6A–6D.

FIG. 7 is a cross-sectional view of an additional embodiment of the wire interconnect structure according to the present invention.

FIGS. 8A–8C are a flow diagram of a method of constructing the embodiment of the present invention shown in FIG. 7.

FIGS. 8A-1 through 8A-4, FIGS. 8B-1 through 8B-4, and FIGS. 8C-1 through 8C-4 collectively show a sequence of cross-sectional views of an interconnect structure according to the present invention at various stages of construction according to the flow diagram shown in FIGS. 8A–8C.

DETAILED DESCRIPTION OF THE INVENTION

FIG. 1 is an isometric view of a first embodiment of the wire interconnect structure according to the present invention, which has been given the general reference designation 10. Wire interconnect structure 10 is for electrically and mechanically coupling a substrate 12 to an integrated circuit (IC) chip 70, as shown in FIG. 1. Interconnect structure 10 may be used to couple an electrical signal between substrate 12 and IC chip 70 to supply power to IC chip 70. Structure 10 comprises substrate 12 and an interconnect column 15, which includes an electrically conductive post 14 disposed on a first surface 13 of substrate 12. Post 14 is for making contact to integrated circuit chip 70 and comprises an elongated body 16, a bottom end 17, and a top end 18.

Bottom end 17 is mounted on surface 13 of substrate 12. Post 14 preferably comprises a metallic material, such as copper, nickel, cobalt, gold, or palladium. In a preferred embodiment of the present invention, the material of post 14 comprises copper.

In a preferred embodiment of the present invention, top end 18 has a substantially flat surface which is substantially co-planer with surface 13. Also in a preferred embodiment, the body 16 of each post 14 of structure 10 is substantially circular in a cross-sectional plane co-planer with the surface of its top end 18. Additionally, each of top end 18 and bottom end 17 is substantially circular in cross-section. Also, the aspect ratio of post 14, i.e., the ratio of its length in the direction of elongation to the diameter of the circular cross-section at its bottom end 18, is preferably greater than 3.5 and is in the range of 4 to 8.

In one embodiment of the present invention, post 14 has a base diameter of ~10 microns, a top diameter of ~15 microns, an average diameter of ~12.5 microns and a height in the range of 40 microns to 80 microns, for example 60 microns (aspect ratio of 6). These dimensions provide the largest aspect ratio that can presently be easily and reliably manufactured with the process steps described below. The height of 40 microns to 80 microns is much shorter than conventional chip-to-substrate wire connections and provides a much lower inductance, on the order of 42 pH or less. In comparison, a BIP interconnect has an inductance of ~250 pH. A $C^4$ interconnect has a comparable inductance of ~50 pH but, as indicated above, has a low aspect ratio which contributes to its fatigue failure rate.

In a preferred embodiment of the present invention, interconnect column 15 further comprises a base pad 20 disposed between surface 13 and bottom end 17 of post 14. Base pad 20 is mounted to surface 13, and bottom end 17 of post 14 is mounted to base pad 20. Preferably, base pad 20 comprises a metallic material, such as copper, nickel, cobalt, gold, or palladium. As described below in greater detail, base pad 20 facilitates the construction of post 14 by electroless or electrolytic plating, and preferably the top layer of base pad 20 comprises the same material as that of post 14.

As an option, interconnect structure 10 may include a wire trace 50 on surface 13 for connecting an electronic signal present within substrate 12 to wire interconnect column 15. This signal may, for example, be generated by circuitry within substrate 12 or connected to substrate 12 by another interconnect structure. Trace 50 is electrically coupled to base pad 20 of interconnect column 15 and, in turn, to post 14. As an equivalent, a via in substrate 12 may be used.

To communicate the signal present on trace 50 to circuitry on integrated circuit chip 70, post 14 is electrically and mechanically connected to integrated circuit 70 via a bump 80 of reflowable and electrically conductive material. (The term "connecting" used herein is intended to have the breadth of the term "coupling" and to mean all means by which elements such as post 14 and chip 70 may be electrically coupled and/or mechanically coupled to one another. For example, electrically connecting is intended to encompass a direct wire connection as well as a capacitive coupling between post 14 and IC chip 70, which may be provided by an element electrically and mechanically coupled between the two.) In one preferred embodiment of the present invention, bump 80 comprises a solder material, which is defined as a material which may be reflowed repeatedly and at a relatively low temperature in comparison to the melting temperature of post 14. Exemplary solder materials include, but are not limited to, lead, tin, indium, gallium, bismuth or any feasible alloy thereof. Of these, indium, indium alloys, bismuth and bismuth alloys are preferred because they have excellent mechanical properties, good elasticity at low temperatures (e.g., −70° C.), and low propensity to emitting alpha particle radiation which could interrupt the operation of chip 70 or destroy some of the circuitry on chip 70.

In another preferred embodiment of the present invention, bump 80 comprises a conductive polymer material. Exemplary conductive polymer materials include, but are not limited to, conductive elastomers, metal-filled thermoplastics (randomly loaded), metal-filled epoxy resins such as silver-filled resins, metal-filled polyimides and epoxy-polyimides, conductive Silicone-based materials, metal-coated compliant plastic spheres, and "Z-axis conductive" adhesives, elastomers and plastics. The use of such conductive polymers has the following advantages. First, a solder flux or "tack bond" would not be required to attach the wire interconnect structure to its corresponding chip or substrate, as is often the case with solder materials. Second, a reducing atmosphere would not be required in the bonding procedure for many of these polymer materials. Both of these advantages reduce the complexity of the bonding equipment and may be more environmentally acceptable. Third, those polymers having low elastic moduli can be used to absorb thermally induced strain and stress. Fourth, for many of these polymers, the distance which the polymer creeps up the post by wicking action (i.e., capillary action) is small and may be readily controlled. Fifth, many of these materials do not have adverse chemical reactions with copper and, therefore, do not require a protective nickel coating over the copper material.

In one embodiment of the present invention in which bump 80 comprises a solder material, bump 80 is initially hemispherical in shape, having a diameter of 25 microns and a height of 5 microns. Bump 80 is disposed on a metallic pad (shown in FIG. 3 at 75) on the surface of chip 70. The pad is preferably circular with a diameter of ~25 microns. In those embodiments of the present invention in which bump 80 comprises a conductive polymer material, bump 80 may have roughly similar initial dimensions. With these bump dimensions, the pad area is approximately 500 $\mu m^2$, which is more than 15 times smaller than the pad areas currently used for $C^4$, BIP, and UNIAX interconnects. As a result, the parasitic capacitance associated with the pad for interconnect column 15 is roughly an order of magnitude less than that for $C^4$ and BIP interconnects (~16 fF versus ~160 fF). It may therefore be appreciated that the structure of interconnect column 15 enables smaller pad sizes to be used, which enables more interconnects per IC chip at higher signal transmission rates.

To couple post 14 to bump 80, both post 14 and bump 80 are heated to a temperature which causes the material of bump 80 to become reflowable, in the case of a solder material, or pliable, in the case of a polymer material. Post 14 preferably comprises a material having a higher melting or reflow temperature point than the material of bump 80. During this heating process, chip 70 and substrate 12 are brought in close proximity to one another such that bump 80 makes contact with top end 18 of post 14. Light pressure, on the order of the weight of integrated circuit chip 70 (for example less than 0.5 N/cm$^2$), is applied between substrate 12 and chip 70 during the contact process. Preferably, the heating process is performed in a forming gas atmosphere, such as 4% to 10% hydrogen in nitrogen, at a temperature exceeding the melting point of the material of bump 80. Once the melting temperature of the material of bump 80 is reached, bump 80 begins to reflow around post 14 near top end 18. Once reflowed, the temperature of substrate 12 and integrated circuit 70 is lowered to cause bump 80 to solidify around post 14, thereby making electrical mechanical coupling thereto.

FIG. 2 is a cross-sectional view of the wire interconnect structure shown in FIG. 1 taken along a vertical plane passing through the line 2—2 shown in FIG. 1. The reference numerals used in FIG. 1 are also used to show the same items in FIG. 2. FIG. 2 shows the features of post 14 in greater detail. In one embodiment of the present invention, post 14 further comprises an interior portion 24 of copper, a coating layer 25 of nickel surrounding interior portion 24, and a nickel oxide layer 26 disposed on nickel layer 25. Layer 25 may typically have a thickness of approximately one micron or less, and oxide layer 26 may have a thickness in the range of 0.1 microns to 0.2 microns. The thicknesses of these layers have been relatively enlarged in the Figures so that these layers may be more clearly shown. Nickel oxide layer 26 extends in the direction of elongation of body 16 from a point 28 near bottom end 17 of post 14 to a point 27 near top end 18 of post 14. As seen in FIG. 1, each of points 27 and 28 is intermediate between bottom end 17 and top end 18 of post 14, with point 28 being intermediate between point 27 and bottom end 17.

Nickel layer 25 acts as a barrier to any solder-copper chemical interactions, which may occur between bump 80 and post 14. As is known in the art, indium can dissolve copper under certain conditions. It may be appreciated that, when using a solder material which does not have adverse chemical interactions with copper, layer 25 may comprise a different material or may not be necessary. In addition to acting as a barrier to solder-copper interactions, layer 25 serves to passivate the outer surface of post 14 to prevent corrosion of the copper interior portion 24.

Oxide layer 26 functions as a solder "dam," i.e., it limits the creep of solder from bump 80 in the direction from top end 18 to bottom end 17. This solder dam is at point 27 and prevents the solder from bump 80 from coating the sides of post 14, and thus increasing the width of post 14 and reducing the aspect ratio of post 14. As is known in the soldering art, most solders do not readily adhere to oxide layers. In this way, the solder dam provided by oxide layer 26 prevents bump 80 from migrating up and increasing the diameter and, therefore, the rigidity of post 14. Thus, the solder dam serves as a means for de-concentrating the mechanical stress and strain at the ends of posts 14.

As shown in FIG. 2, interconnect column 15 further comprises a peripheral edge 19 formed around bottom end 17 next to surface 13. In a preferred embodiment of interconnect column 15, a fillet 22 of rigid material is disposed along peripheral edge 19. Fillet 22 preferably comprises a solder. An exemplary solder for fillet 22 is an alloy of 63% tin (Sn) and 37% lead (Pb). Fillet 22 contacts portions of base pad 20 and of post 14 near bottom end 17, and has an outside surface extending between post 14 and base pad 20 which is preferably concave. Fillet 22 extends up post 14 from end 17 to substantially point 28. In one embodiment, point 28 is approximately 3 microns from bottom end 17. Fillet 22 extends outward on base pad 20 to a point 29. In the same embodiment, point 29 is approximately 3 microns from the peripheral edge 19 at bottom end 17.

Fillet 22 serves to de-concentrate any of the mechanical stress and strain at the junction of end 17 and base pad 20 that may occur when post 14 is flexed. For example, when a force parallel to surface 13 is applied to the right side of post 14 near top end 18 by chip 70, post 14 will flex such that end 18 is displaced towards the left of its resting point. When flexed in this manner, forces are transmitted to fillet 22 which distribute the forces over a larger area, thereby preventing bottom end 17 from detaching from base pad 20. The transmitted forces include compressive forces applied to fillet 22 at the top of fillet 22 at its left side near point 28 and to the bottom of fillet 22 at its right side near point 29, and tensile forces applied at the right top side and the bottom right side of fillet 22. As the transmitted forces are distributed over a larger area, fillet 22 comprises means for de-concentrating mechanical strain at bottom end 17 of post 14.

As indicated above, when bump 80 is joined to interconnect column 15, bump 80 reflows around post 14, ending substantially at point 27. This is shown in FIG. 3, which shows a cross-section of wire interconnect structure 10, interconnect column 15, substrate 12 and IC chip 70 taken through a vertical plane lying along line 2—2 shown in FIG. 1. Bump 80 also reflows outwardly along the surface of IC chip 70. In one embodiment of the present invention, bump 80 comprises solder disposed on a circular conductive pad 75 of IC chip 70 having a diameter of ~25 microns. Pad 75 is surrounded by material which does not readily wet to solder. A non-wettable ring is thereby formed around pad 75, which forces the solder material to have a certain height (i.e., ball limiting metalization). For a 25 micron circular pad, this height is approximately 5 microns. Bump 80 may be deposited on IC chip 70 using any of the following standard methods of bump deposition well known in the art: lift-off, subtractive, additive, or shadow-mask vapor deposition. Each of these methods is well known in the art and a detailed explanation thereof is not necessary in order to understand the present invention and enable one of ordinary skill in the art to make and use the same.

FIG. 4 is an isometric view of a wire interconnect structure comprising an array of interconnect columns, each interconnect column in the array being the same as interconnect column 15 shown in FIGS. 1 and 2 with the exception that the corresponding electrical trace 50 for each structure is not necessarily oriented in the same direction as that shown in FIGS. 1 and 2. The wire interconnect array has been given the general reference designation of 100 in FIG. 4. Wire interconnect array 100 comprises a plurality of interconnect columns 15 disposed on substrate 12. Using present technology, these interconnect structures may be spaced as close as 30 microns to one another, a distance which may be substantially less than their height. Also shown in FIG. 4 is an integrated circuit chip 70' having a plurality of bumps 80. The plurality of bumps 80 are configured in a "mirrored" array corresponding to array 100 such that each bump is in a generally confronting and corresponding relationship to a respective interconnect column 15. The interconnect columns 15 are bonded to their respective bumps 80 with the above-described heat-reflow process after first being brought into registration by known means.

The heights of each of the interconnect columns 15 are preferably within 2 microns of one another. As a practical matter, integrated circuit chip 70' may have a surface which is warped, with a typical maximum deviation of approximately 2 microns from low point to high point. As such, not every interconnect column 15 will make contact to the surface of integrated circuit chip 70'. However, generally at least three of the interconnect structures will contact the surface of integrated circuit chip 70'. Given that the maximum warpage of the surface of chip 70' is approximately 2 microns and that the variation in height of interconnect columns 15 is approximately 2 microns, there is a possibility that one or more of the interconnect columns 15 may be spaced approximately 4 microns away from the surface of chip 70' after the contacting process is completed. However, bump 80 is typically at least 5 microns high and is able to contact its corresponding interconnect structure 10 and form a bond thereto should such a gap exist between the interconnect column and chip 70'. As bump 80 is made from a conductive material, an electrical signal is able to be transmitted between interconnect structure 10 and chip 70' even if interconnect column 15 does not physically touch the surface of chip 70' (e.g., pad 75). It may be appreciated that bumps of solder material can be formed up to a height of 75 microns so that contact can be made if the spacing between chip 70' and an interconnect structure 10 is greater than 5 microns.

In the embodiments of the present invention in which bumps 80 comprise a metal, such as indium, bismuth, gallium, tin, lead, or their alloys, the surface tension of bump 80, when molten, aids in bringing the array of bumps 80 into alignment with array 100. Under reflow conditions, each of the metal bumps 80 seeks a minimum surface area around the corresponding interconnect column 15 of the wire interconnect array 100 as it flows around the structure, the minimum surface area being achieved when the bump is symmetrically disposed around the top end of its corresponding column 15. The surface tension of each bump surface applies a force between its respective IC chip pad and its corresponding interconnect column 15 in a direction which causes the bump to be symmetrically positioned around its corresponding interconnect column. As such, any misalignment that may occur in positioning IC chip 70' over array 100 before the heat-bonding process will be corrected, or minimized, by the surface tension forces as long as there is an initial contact of a few bumps with their corresponding interconnect structures. Depending upon the material of bump 80 and the size and geometry of the interconnect structure, the surface tension forces can be significant, and may be quite large in comparison to the gravitational force applied to chip 70' during the heat-bonding process.

In one embodiment of the present invention, elongated body 16 of post 14 is tapered such that bottom end 17 is smaller, i.e., has a smaller cross-sectional area, than top end 18. This aids in the above-described alignment of chip 70' and array 100 by surface tension forces since it provides a large surface area for top end 18 while making it easier for post 14 to be flexed near the bottom of the post by the surface tension forces applied at top end 18. (The tapered shape, along with leverage effects, allows post 14 to flex more near the middle and bottom than the top.) Such flexing helps to bring an interconnect column 15 and its corresponding bump 80 into closer alignment in cases where they initially are not well centered (i.e., aligned).

FIG. 5 is a cross-sectional view of a second embodiment of the wire interconnect structure according to the present invention, which has been given the general reference designation of 200. The embodiment is referred to as wire interconnect structure 200 and is for electrically coupling a major substrate 90 to integrated circuit chip 70', as shown in FIG. 5. Wire interconnect structure 200 may be used for coupling electrical signals and power between major substrate 90 and IC chip 70'. Wire interconnect structure 200 comprises an interconnect substrate 212 disposed intermediate between major substrate 90 and IC chip 70', and having a first surface 213 and a second surface 214. Interconnect substrate 212 is also referred to as an interposer substrate or an intermediate substrate because it is disposed between substrate 90 and chip 70'. Wire interconnect structure 200 further comprises a first interconnect column 15a on surface 213 constructed according to the first embodiment of the present invention shown in FIGS. 1-3, and a second interconnect column 15b on surface 214, also constructed according to the first embodiment of the present invention. Each of the interconnect columns 15a and 15b comprises a post 14 with elongated body 16 and ends 17 and 18, a base pad 20, a fillet 22, and a peripheral edge 19, as described above. Additionally, post 14 comprises an interior portion 24, a coating layer 25, and an oxide layer 26, all as described above. The reference numerals used in describing interconnect column 15 shown in FIGS. 1-3 have been used for interconnect columns 15a and 15b of FIG. 5.

First interconnect column 15a is disposed on first surface 213 of substrate 212 such that its bottom end 17 and base pad 20 are mounted to surface 213. First interconnect column 15a is for making contact to IC chip 70'. In a similar manner, second interconnect column 15b is disposed on second surface 214 of substrate 212, such that its bottom end 17 and base pad 20 are mounted to second surface 214. Second interconnect column 15b is for making contact to major substrate 90.

Interconnect structure 200 further comprises a coupling means for electrically coupling first interconnect column 15a to second interconnect column 15b. In a preferred embodiment of the present invention, the coupling means comprises a through hole 220 passing through substrate 212 between first surface 213 and second surface 214, which is filled with a plug of conductive material 224. Through hole 220 includes a first end 221 next to base pad 20 and bottom end 17 of interconnect column 15a, and a second end 222 next to the base pad 20 and bottom end 17 of second interconnect column 15b. Plug 224 preferably comprises a metal, such as copper, or metal alloy which is formed within through hole 220. Plug 224 makes electrical contact to corresponding pads 20 of each of interconnect columns 15a and 15b and forms a conductive path therebetween, thereby electrically coupling columns 15a and 15b to one another.

Interconnect substrate 212 may have a thickness in the range of 100 microns to 2,000 microns, with a value of 250 microns being presently preferred. Additionally, substrate 212 is formed from a non-conductive material and is preferably rigid. For example, substrate 212 may comprise a ceramic material, alumina, a glass material, sapphire, or a composite of polyimide and a rigid material. Through hole 220 is preferably circular in cross-section (as seen from the top plan view of substrate 212), and preferably has a diameter in the range of 12 microns to 50 microns. In one embodiment of interconnect structure 200, through hole 220 has a diameter of approximately 25 microns. Through hole 220 may be formed through substrate 212 by such means as laser drilling, photo etching followed by chemical milling, or by punching techniques. Such techniques are well known to those skilled in the art. The preferred technique used will likely depend on the choice of substrate material.

Also in a preferred embodiment of interconnect structure 200, the posts of interconnect columns 15a and 15b are disposed substantially opposite to one another at respective opposite ends of through hole 220 to facilitate the electrical connection therebetween. However, it may be appreciated that the interconnect columns may be somewhat offset from an exact opposing relationship, as shown, for example, by two interconnect columns 15c and 15d in FIG. 5. Interconnect column 15c is disposed on surface 213 and interconnect column 15d is disposed on surface 214. Interconnect columns 15c and 15d are disposed at opposite ends of a through hole 220a, with an offset 230 in the placement of interconnect column 15d. Such an offset may occur during the construction of interconnect column 15d. As described below in greater detail, photo-lithographic steps applied separately to surfaces 213 and 214 of substrate 212 may be used to form interconnect columns 15c and 15d. The use of separate photo-lithographic steps is susceptible to alignment errors, which may give rise to offset 230. In one embodiment of the present invention, base pad 20 of each interconnect columns 15a–15d is approximately 40 microns wide and the bottom end 17 is approximately 10 microns in diameter, thereby allowing a 15 micron misalignment error for each of interconnect columns 15a and 15b. Other, more complex structures for interconnecting columns 15a and 15b can be used. It is not intended that the present invention be limited to the use of through holes or opposing interconnect columns.

As indicated above, not all of the interconnect columns 15a and 15b may have the same height, and integrated circuit chip 70' may be warped. Substrate 212 and major substrate 90 may each also be warped, usually each on the order of 2 microns or less, measured from low point to high point. As such, there may be one or more interconnect columns in an array of such columns which does not fully contact either integrated circuit chip 70' or major substrate 90. Such a case in which contact is not made to either of chip 70' and substrate 90 is shown by two interconnect columns 15e and 15f in FIG. 5, as an example. Two gaps 231 and 232 are shown between interconnect column 15e and IC chip 70' and between interconnect column 15f and major substrate 90, respectively. However, as described above with reference to interconnect structure 10, the initial 5 micron height of bump 80 is generally sufficiently high to make electrical contact to an interconnect column which does not physically make contact to its corresponding substrate or IC chip.

Methods for constructing wire interconnect structures 10 and 200 are now described. FIGS. 6A–6D show a flow diagram 300 for constructing wire interconnect structure 200. Flow diagram 300 comprises a number of blocks 302–338, and proceeds from one block to the next in sequential order. It may be appreciated that, since interconnect structure 200 comprises interconnect structure 10, the steps for constructing interconnect structure 200 comprise the steps for constructing interconnect structure 10. These steps for constructing interconnect structure 10 are identified below. In a preferred embodiment of the present invention, the step or steps described by each of blocks 306–330 are performed on each side of substrate 212 before proceeding to the next step. Whenever feasible, the step or steps of each of blocks 306–330 (such as electroless plating) may be performed on both sides simultaneously. However, those skilled in the art will recognize that the steps of blocks 306–330 may be performed on one side of substrate 212 before being performed on the other side by using a protective coating, such as black wax, to protect each substrate side while the other side is being processed.

Flow diagram 300 begins at block 302 with starting substrate 212, which may be made of ceramic. At block 304, through hole 220 is formed through substrate 212 and then plated with conductive material 224. A partial cross-sectional view of substrate 212 showing through hole 220 after the processing of block 304 is shown at 304A in FIG. 6A-1. In order to more clearly show the features of the layers to be subsequently deposited on the surfaces of substrate 212, the horizontal dimension of substrate 212 has been relatively expanded in the drawings shown in the FIGS. 6A–6D and the dimensions of some features have been enlarged so as to make them more readily apparent in these Figures. Through hole 220 may be formed in substrate 212 by a number of methods known in the art as described above. Likewise, conductive material 224 may be formed by a number of methods known in the art. For a single wire interconnect structure 10, the formation of through hole 220 is not a requirement, but may be performed if it provides an advantage in arranging the signal traces on substrate 212 for a particular application.

In one embodiment of the method of the present invention, through hole 220 may be formed and plated with conductive material 224 by the following sequence of steps. First, conductive through holes 220 are formed by either laser drilling or chemical milling from one surface, e.g., the "top" surface. As a second step, a layer of conductive material, such as copper, is sputtered on the other surface, the "back surface" of substrate 212. This sputtered layer will provide a seed layer for a subsequent plating step. As a third step, a conductive material, such as copper, is formed within through holes 220 by electrolytic or electroless plating. As a fourth step, a non-conductive protective layer is deposited on the front surface to protect the through holes 220 from a subsequent etching step. As a fifth step, the metal layer on the back surface is removed by etching. Finally, the protective layer on the front surface is removed and the surfaces of substrate 212 may be mechanically lapped to provide planar surfaces.

At block 306, a base pad 20 for each interconnect column 15a and 15b is formed. For each side of substrate 212, the following steps are performed. First, a seed layer of copper is sputtered on each surface of substrate 212. Preferably, the seed layer may comprise an initial thin layer of chromium followed by a thin layer of copper (Cr/Cu), may comprise an initial thin layer of titanium followed by a thin layer of copper Ti/Cu), or may comprise a titanium-tungsten alloy layer (50%—50%) followed a layer of copper (Ti—W/Cu). Prior to depositing the seed layer, the surfaces of substrate 212 are cleaned well so as to activate these surfaces for the sputtered seed layer. Second, a photoresist (PR) layer is applied to each substrate side, and portions of the photoresist are removed where pads 20 are to be formed (e.g., exposing the photoresist to UV light through a mask and developing). This exposes the seed layer where pads 20 are to be formed. Third, copper is electroplated onto the exposed areas of the seed layer to a desired thickness, of for example ~1 micron, to form pads 20. The photoresist is then removed. The appearance of substrate 212 and pads 20 at the end of these steps is shown at a partial cross-section 306A of substrate 212 in FIG. 6A-2. A single wire interconnect structure 10 or a one-sided interconnect array 100 may be formed by only processing one side of substrate 212.

The copper plug 224 in through hole 220 and pads 20 on the surfaces of substrate 212 collectively comprise an electrical conductive path from a first area (i.e., pad 20) on surface 213 to a second area (i.e., pad 20) on surface 214. It may be further appreciated that the above steps for forming through hole 220 and pads 20 collectively comprise a means for forming such an electrically conductive path.

At block 308, substrate 212 is prepared for the formation of fillet rings for fillets 22. At block 308, a layer 350 of photoresist is spun on each side (surface) of substrate 212. Next, a portion of layer 350 is removed over each base pad 20 where the fillets 22 are to be formed. In a preferred embodiment of the present invention, this portion is annular in shape (i.e., a ring shape or "doughnut" shape). The portions of layer 350 may be removed by exposing the photoresist to ultra violet (UV) light through a mask and developing it, as is well known in the processing art. A partial cross-sectional view of substrate 212, pads 20, and layers 350 at the end of these steps is shown at a diagram 308A in FIG. 6A-3. With these steps, a ring of each base pad 20 is exposed for later plating. Each ring surrounds the area where bottom end 17 of a corresponding post 14 is to be formed. In one embodiment of the present invention, each ring has ring width of approximately 3 microns, an inner diameter of approximately 9 microns and an outer diameter of approximately 15 microns.

At block 310, the fillets 22 are formed over corresponding pad rings. For each pad ring, a body of solder is deposited, preferably by electrolytic plating, in the ring of base pad 20. The solder body is deposited in the ring and in close proximity to where the posts 14 are to be formed. The solder fillet bodies 22, layer 350, and substrate 212 at the end of the processing steps of block 310 are shown by a partial cross-sectional view 310A in FIG. 6A-4. In one embodiment, each fillet 22 is approximately 3 microns high and approximately 3 microns wide. After the posts 14 of interconnect columns 15a and 15b are formed, the solder material of fillets 22 will be heated and reflowed.

At block 311, photoresist layer 350 is removed and the seed layer deposited in block 306 is etched away. In the case where the seed layer comprises a copper layer over a titanium layer (Cu/Ti), the seed layer may be removed by first exposing it to a solution of ammonium persulfate (($NH_4)_2S_2O_8$) to remove the copper layer and then dry etching it, or wet etching it in hydrofluoric (HF) acid, to remove the titanium. In the case where the seed layer comprises a copper layer over a chromium layer (Cu/Cr), the seed layer may be removed by first exposing it to a solution of ammonium persulfate, as above, then wet etching it with a solution of hydrofluoric acid (HF) to remove the chromium. In each of the above cases, a solution of copper chloride ($CuCl_2$) and potassium hydroxide (KOH) may be used to etch the copper layer instead of ammonium persulfate. Substrate 212, pads 20, and solder fillets 22 at the end of these processing steps are shown by a partial cross-sectional view 311A in FIG. 6A-5.

At block 312, a layer 354 of polyimide is deposited on each side (i.e., surfaces 213 and 214) of substrate 212. Polyimide layer 354 is "spun" on, and then cured at an elevated temperature, as is known in the art. Layer 354 comprises a spacer layer, which will be used in a later step to form posts 14. A partial cross-sectional view of substrate 212 and layer 354 at the end of these steps is shown at a diagram 312A in FIG. 6B-1.

At block 314, a mask layer 356 of aluminum is deposited on both sides of substrate 212, for example by sputtering. Mask layer 356 provides a means for masking polyimide layer 354 during a later etching process, discussed below in greater detail. Other materials which are more resistant to etching than the material of spacer layer 354 may be used instead of aluminum for layer 356. At block 316, mask layer 356 is patterned such that portions of the aluminum may be removed from those locations where posts are to be formed, which are designated as post locations 358. This preferably comprises the steps of depositing a photoresist layer over mask layer 356, exposing the photoresist layer to UV light, developing the photoresist such that polymerized photoresist overlies layer 356 in those locations where posts are not to be formed. Next, mask layer 356 is exposed to an aluminum wet etch, for example a buffered hydrochloric acid (HCl) solution, which removes portions of the aluminum overlying those locations where posts 14 are to be formed, i.e., locations 358. A partial cross-sectional view of substrate 212, etched layer 356, and locations 358 at the end of these steps is shown at a diagram 316A in FIG. 6B-2. This exposes portions of the spacer layer 354 which overlie the areas of pads 20 where the posts 14 are to be formed.

At block 317, portions of spacer layer 354 underlying post locations 358 are removed. This is may be done by reactive ion etching, other plasma etching processes, or wet etching processes. These portions of layer 354 are removed to expose respective areas of pads 20 upon which respective posts 14 are to be built. An etch process is selected such that relatively little aluminum (layer 356) is removed. Bottom ends 17 of posts 14 are to be mounted at these exposed areas of pads 20. In a preferred embodiment, reactive ion etching (RIE) is used as the etch process. Aluminum is more resistant to reactive ion etching than most polyimide materials (spacer layer 354). A high aspect ratio is best formed by RIE. At block 318, the mask layer 356 is removed, or stripped, by a suitable chemical stripper. In one embodiment, a buffer solution of hydrochloric acid (HCl) is used as a chemical stripper. A partial cross-sectional view of substrate 212 and the etched portions of layers 354 at the end of this step is shown at a diagram 318A in FIG. 6B-3.

The removed portions of layer 354 are commonly referred to as vias. The longitudinal cross-section shape of each via is roughly trapezoidal. Preferably, the etching of layer 354 exposes the inner surface of each fillet 22, next to where the corresponding post 14 is to be formed. This will allow fillet 22 to be readily reflowed around the bottom portion of post 14 at a later step described below. In one embodiment of the present invention, each via has a bottom width (near a respective end 17) of approximately 10 microns and each corresponding fillet 22 is a ring having an inner diameter of ~9 microns. In this embodiment, the via is preferably aligned to its corresponding fillet 22 such that approximately one-half micron width of fillet 22 is exposed by the via.

It may be appreciated that, as an alternative embodiment, spacer layer 354 may comprise a photo-imageable polyimide material which may be patterned and developed in a manner similar to that of a photoresist. In such a case, the deposition, pattering, and stripping of mask layer 356 as described in blocks 314, 316, and 318 may be eliminated. In lieu of these steps, the vias would be directly patterned in spacer layer 354 by exposure to a suitable light source through a suitable mask, and the exposed portions would be developed by a suitable chemical developer. Presently available photo-imageable polyimides are limited in their ability of providing high via aspect ratios. As such, the alternate embodiment using the photo-imageable polyimide is not currently preferred. However, it is believed by the inventors that photo-imageable polyimides capable of providing higher aspect ratios may be commercially available in the future.

At block 320, a conductive material, preferably copper, is deposited on the exposed areas of pads 20. This is preferably done by electroless plating both surfaces of substrate 212. The copper material is only deposited on the exposed surface of each base pad 20 and is not deposited on the top of polyimide layer 354. In this regard, layer 354 also functions as a plating mask. The copper material builds up from each base pad 20 in the corresponding via thereby forming the interior portion 24 of each post 14. A partial cross-sectional view of substrate 212 and of posts 14 at the end of this step is shown at a diagram 320A in FIG. 6C-1. This step comprises the step of depositing a conductive material on the exposed portions of pads 20 such that a first conductive post is formed on the top surface of substrate 212 and mounted to base pad 20, and such that a second conductive post is formed on the bottom surface of substrate 212 and mounted thereto.

At block 322, layer 354 is removed by stripping the polyimide material, as for example by using a plasma or wet etch. At block 324, fillets 22 are reflowed around the peripheral edge 19 of each post 14. This is preferably done by exposing substrate 212 and posts 14 to an elevated temperature in an inert atmosphere for a suitable amount of time. In one embodiment of the present invention, the elevated temperature of approximately 30° C. above the melting point of the material of fillet 22 for the time duration is approximately three (3) minutes. As an example, a 60/40 (tin/lead) solder having a melting point of 187° C. would be reflowed at ~220° C. A partial cross-sectional view of substrate 212 and posts 14 at the end of these steps is shown at a diagram 324A in FIG. 6C-2.

At block 326, a thin coating layer 25 of nickel is plated on the exposed portions of posts 14, preferably by electroless plating. Layer 25 may be as thin as one micron or less. At block 328, a nickel oxide layer 26 is formed around the exposed portions of post 14 by annealing substrate 212 and posts 14 in the presence of oxygen. In one embodiment of the present invention, this occurs in an air-ambient for approximately four (4) hours at approximately 150° C. A partial cross-sectional view of substrate 212 and posts 14 at the end of these steps is shown at a diagram 324A in FIG. 6C-2. The oxide formation step may also serve to anneal the deposited copper layers 20 and 24.

At block 330, a portion of oxide layer 26 at the top end 18 of each post 14 is removed. This is done by dipping each top end 18 in a thin layer of a low surface-tension, high-viscosity, low-pH solder flux or other suitable solution. In one embodiment of the present invention, this solder flux has a viscosity of ~30,000 centipoise and a pH of ~2. The layer thickness (i.e., depth) of the flux is preferably around ~2 microns, such that approximately 5 microns of the nickel oxide from the top end 18 towards the bottom is removed. A partial cross-sectional view of substrate 212 and posts 14 at the end of this step is shown at a diagram 330A in FIG. 6D-1. In this way, oxide layer 26 is formed over nickel layer 25 of each post such that oxide layer 26 extends in the direction of elongation of each post from near the bottom end 17 to a point intermediate between the bottom and top ends of the post. This intermediate point is shown at 27 in diagram 330A.

Substrate 212 may comprise a single interconnect substrate for interconnecting a single IC chip to a major substrate, or may comprise a number of individual interconnect substrates. In the latter case, a number of individual interconnect substrates are processed together on substrate 212, thereby reducing the overall fabrication cost and time per interconnect substrate. After processing, these individual interconnect substrates are separated for their respective uses. This may be done by first coating each side of substrate 212 with black wax and then separating (i.e., dicing) each of the individual interconnect substrates with a diamond saw. The black wax provides a supporting cushion for the interconnect posts 14 during the sawing operation, such that they are not broken off. After sawing, the black wax may be removed by a common solvent which is not destructive to the wire interconnect structures. These steps are shown by flow diagram 300 at blocks 332, 334, and 336 in FIG. 6D. Flow diagram 300 ends at block 338.

For forming a single wire interconnect structure 10, it may be appreciated that the above steps indicated in blocks 306 through 336 need only be applied to one surface of substrate 212.

FIG. 7 is a cross-sectional view of an additional embodiment of the wire interconnect structure according to the present invention, which has been given the general reference designation 400. Wire interconnect structure 400 comprises an interconnect substrate 412 and interconnect columns 415, 415a, and 415b, which are essentially identical in structure to one another except for their location. Wire interconnect structure 400 may be used for coupling electrical signals and power between a substrate 412 to an IC chip, such as chip 70' shown in FIG. 5. Interconnect substrate 412 may have a thickness in the range of 100 microns to 2,000 microns, with a value of 250 microns being presently preferred. As with substrate 212 discussed above, substrate 412 is formed from a nonconductive material and is preferably rigid. Substrate 412 may comprise the same materials as substrate 212.

Interconnect column 415 comprises an electrically conductive post 14 disposed on a first surface 413 of substrate 412. Post 14 is for making contact to an integrated circuit chip and comprises an elongated body 16, a bottom end 17, and a top end 18. Bottom end 17 is mounted on surface 413 of substrate 412. Post 14 preferably comprises a metallic material, such as copper, nickel, cobalt, gold, or palladium. In a preferred embodiment of the present invention, the material of post 14 comprises copper. In one embodiment of the present invention, post 14 further comprises an interior portion 24 of copper material and a coating layer 25 of nickel material surrounding interior portion 24. Layer 25 may typically have a thickness of approximately one micron or less, and may be oxidized in the manner described above with reference to interconnect column 15 (FIGS. 1–5) to provide a solder dam means.

In one embodiment of the present invention, top end 18 has a substantially flat surface which is substantially co-planer with surface 413. Additionally, body 16 is substantially circular in a cross-sectional plane co-planer with the surface of top end 18, and each of the top end 18 and bottom end 17 is substantially circular in cross-section. Also in this embodiment, the aspect ratio of post 14 is preferably greater than 3.5 and is in the range of 4 to 8. For example, post 14 may have a base diameter of ~10 microns, a top diameter of ~15 microns, an average diameter of ~12.5 microns and a height in the range of 40 microns to 80 microns, for example 60 microns (aspect ratio of 6).

In a preferred embodiment of the present invention, interconnect column 415 further comprises a base pad 20 and a base pedestal 21. Base pad 20 is mounted to surface 413 and disposed between surface 413 and base pedestal 21. Base pedestal 21 is mounted to base pad 20 and disposed between base pad 20 and bottom end 17 of post 14. Bottom end 17 of post 14 is mounted to base pedestal 21. Preferably, each of base pad 20 and base pedestal 21 comprises a metallic material, such as copper, nickel, cobalt, gold, or palladium. Base pad 20 and base pedestal 21 facilitate the construction of post 14 by electroless or electrolytic plating, and preferably comprise the same material as that of post 14. In one embodiment of the present invention, base pedestal 21 has a cross-sectional width which is smaller than the corresponding cross-sectional width of base pad 20, and has a thickness on the order of one to two microns.

Base pedestal 21 not only provides mechanical stability but provides the benefit of allowing post 14 to be constructed in close contact with fillet 22 and the benefit of better control over the dimensions of post 14. As is known in the semiconductor art, the planar dimensions of the smallest feature which can be reliably defined by photoresist layers and spacer layers is proportionally related to the thickness of the layer. Smaller feature sizes and closer spacings of adjacent features, such as pedestals 21, can be achieved with thinner spacer and photolithographic layers. As base pedestal 21 has a shorter height ($\sim 1$ $\mu$m–$\sim 2$ $\mu$m) than the overall height of post 14, base pedestal 21 allows its corresponding post 14 to be positioned during processing with greater precision, particularly with respect to fillet 22. The remainder of post 14 may then be built on top of pedestal 21 to obtain the overall height of post 14 with less precise construction steps (e.g., with thicker spacer and photo-lithographic layers). An exemplary construction process for post 14 is described in greater detail below.

Interconnect column 415 further comprises a peripheral edge 19 formed around bottom end 17 next to surface 413, and in particular the outer peripheral portions of base pad 20 and base pedestal 21. In a preferred embodiment of interconnect column 415, a fillet 22 of rigid material is disposed along peripheral edge 19. Fillet 22 preferably comprises a solder. An exemplary solder for fillet 22 is an alloy of tin and lead, such as 60/40 (tin/lead). Fillet 22 contacts the outer portions of base pad 20, outer portions of base pedestal 21, and portions of post 14 near bottom end 17, as shown in FIG. 7. Fillet 22 has an outside surface extending between post 14 and base pad 20 which may be "S"-shaped. Fillet 22 extends up post 14 from end 17 to substantially point 28. Fillet 22 extends outward from pedestal 21 onto base pad 20 to a point 29. Fillet 22 preferably is disposed in (i.e., fills in) the corner formed between pedestal 21 and base pad 20. As with previously described embodiments of the present invention, fillet 22 serves to de-concentrate the mechanical stress and strain at the junction of end 17 and base pedestal 21 that may occur when post 14 is flexed. Fillet 22 also serves to de-concentrate the mechanical stress and strain at the junction between base pedestal 21 and pad 20.

As indicated above, each of interconnect columns 415a and 415b is essentially identical in structure to interconnect column 415. The reference numerals used in describing interconnect column 415 have been used for interconnect columns 415a and 415b.

As an option, interconnect structure 400 may include wire traces 50, 50a, and 50b on surface 413 for coupling electronic signals or power present within substrate 412 to wire interconnect columns 415, 415a, and 415b, respectively. The electrical signals may, for example, be generated by circuitry within substrate 412 or coupled to substrate 412 by another interconnect column structure. As an example, trace 50 is electrically coupled to base pad 20 of interconnect column 415 and, in turn, to post 14 by way of base pedestal 21. As an equivalent, a via in substrate 412 may be used, as taught above with reference to interconnect structure 200 shown in FIG. 5.

Interconnect structure 400 may be joined to an IC chip, such as IC chip 70', in any of the above described ways. Solder bumps, such as bumps 80, would be disposed on the IC chip in correspondence to the positions of interconnect columns 415, 415a, and 415b. When joined, each bump reflows around the post 14 of its corresponding interconnect column.

It may be appreciated that interconnect columns constructed according to interconnect column 415 of the present invention may be disposed on the second surface 414 of substrate 412. Additionally, a coupling means may be included for electrically coupling an interconnect column on surface 413 to a corresponding interconnect column on surface 414, as for example by a through hole passing through substrate 412 between surfaces 413 and 414 which is filled with a plug of conductive material, as taught above with reference to wire interconnect structure 200. In such a case, interconnect structure 400 could be used for coupling an IC chip to a major substrate, such as substrate 90 shown in FIG. 5.

An exemplary method for constructing exemplary wire interconnect structure 400 is now described. FIGS. 8A–8C are a flow diagram 700 of a method of constructing an exemplary embodiment of wire interconnect structure 400 shown in FIG. 7. Flow diagram 700 comprises blocks 702–738. Flow diagram 700 proceeds through the construction blocks 702–738 in sequential order, and begins at block 702 with a starting substrate 412, which may be made of ceramic. At block 704, a seed layer 451 is deposited on a surface 413 of substrate 412, as for example by sputtering. Preferably, seed layer 451 may comprise an initial thin layer of chromium followed by a thin layer of copper (Cr/Cu), may comprise an initial thin layer of titanium followed by a thin layer of copper (Ti/Cu), or may comprise a titanium-tungsten alloy layer (50%—50%) followed by a layer of copper (Ti—W/Cu). Prior to this step, substrate surface 413 is cleaned well so as to activate the surface for the sputtered seed layer. Seed layer 451 is later etched to define the base pads 20 for interconnect structures 415. A partial cross-sectional view of substrate 412 showing seed layer 451 after the processing of block 704 is shown at 704A in FIG. 8A-1.

In order to more clearly show the features of the layers to be subsequently deposited on the surfaces of substrate 412, the horizontal dimension of substrate 412 has been relatively expanded in the diagrams shown in the FIGS. 8A-8C and the dimensions of some features have been enlarged so as to make them more readily apparent in these Figures.

At block 706, the locations 452 where base pedestals 21 are to be formed are defined. A layer 454 of photoresist, either positive or negative type, is deposited over seed layer 451. Layer 454 is masked and developed by conventional steps known to one of ordinary skill in the semiconductor processing art. After these steps, seed layer 451 is exposed in locations 452. The appearance of substrate 412 and the locations 452 at the end of these steps is shown at a partial cross-section 706A of substrate 412 in FIG. 8A-2. In one embodiment of the present invention, each location 452 and pedestal 21 is circular in shape (as seen in a top plan view), having a diameter in the range between ~10 microns and ~15 microns. At block 708, a conductive material, preferably copper, is deposited in locations 452 on the exposed portions of layer 451 to form base pedestals 21. This may be done by electroless plating or by electrolytic plating substrate surface 413. The copper material is not deposited on the top of photoresist layer 454. In this regard, layer 454 also functions as a plating mask. A partial cross-sectional view of substrate 412 and of base pedestals 21 at the end of this step is shown at a diagram 708A in FIG. 8A-3. In one embodiment of the present invention, base pedestals 21 are plated to a thickness in the range of one to two microns.

At block 710, layer 454 is removed, or stripped, by a suitable chemical stripper. Next, at block 712, locations 456 for fillets 22 are defined. There is a fillet location 456 for each base pedestal 21. Each location 456 has a ring shape which overlies the outer peripheral portion of a corresponding base pedestal 21 and a portion of seed layer 451 adjacent to the outer peripheral edge of the base pedestal 21. In one embodiment, the ring width of each location is on the order of 5 microns, with approximately half of the ring width overlying a corresponding base pedestal and the remaining ring width overlying the adjacent portion of layer 451. To define locations 456, a second photoresist layer 458 is deposited, masked, and developed by conventional steps known to one of ordinary skill in the semiconductor processing art. Layer 458 may be either positive or negative type. After these steps, pedestal 21 and seed layer 451 are exposed in locations 456. A partial cross-sectional view of substrate 412, locations 456, layer 458, and base pedestals 21 at the end of this step is shown at a diagram 712A in FIG. 8A-4.

At block 714, a body of solder is deposited, preferably by plating, in locations 456. This forms a fillet 22 over the exposed portion of each base pedestal 21 and the adjacent exposed portion of seed layer 451. The solder body is deposited in the ring and in close proximity to where a corresponding post 14 is to be formed. Electroless or electrolytic plating may be used for the plating. Solder is not deposited over layer 458. In this regard, layer 458 also functions as a plating mask. Next, at block 716, layer 458 is removed, or stripped, by a suitable chemical stripper. Fillets 22 and substrate 412 at the end of the processing steps of block 716 are shown by a partial cross-sectional view 716A in FIG. 8B-1. In one embodiment, each fillet 22 is approximately 3 microns high and approximately 5 microns wide.

With the above steps, fillet 22 may be closely positioned to base pedestal in 21. Because of the relatively short height of base pedestal in comparison to the overall height of the posts to be formed later, relatively thin photoresist layers may be used in patterning fillets 22. As discussed above, this allows more precise control over the dimensions of fillet 22 and pedestal 21 as well as their alignment to one another.

At block 717, portions of seed layer 451 are removed to define pads 20 and to electrically isolate selected posts 14 from one another, as may be required by the specific application for which interconnect structure 400 is being constructed. In one embodiment, the exposed areas of layer 451, i.e., those not covered by fillets 22 or pads 20, are removed with a suitable chemical etchant. The etchant preferably etches the material of fillet 22 at a relatively slow rate, if at all. In one embodiment of the present invention where seed layer 451 and pad 20 comprise the same material (such as copper), the etching of seed layer 451 also etches portions of pads 20. However, each pad 20 is much thicker than the seed layer 451 and the etch time is controlled to be only as long as necessary to completely etch the exposed areas of seed layer 451. Fillets 22 and substrate 412 at the end of the processing steps of block 716 are shown by a partial cross-sectional view 717A in FIG. 8B-2.

In the case where seed layer 451 comprises a copper layer over a titanium layer (Cu/Ti), seed layer 451 may be removed by a wet etch of ammonium persulfate $((NH_4)_2S_2O_8)$ followed by a dry etch, as described above. In the case where seed layer 451 comprises a copper layer over a chromium layer (Cu/Cr), seed layer 451 may be removed by wet etch of ammonium persulfate followed by a wet etch of hydrofluoric acid (HF), as described above. In each of the above cases, a solution of copper chloride ($CuCl_2$) and potassium hydroxide (KOH) may be used to etch the copper layer instead of ammonium persulfate.

As an option, electrical traces 50 may be formed by leaving selected portions of seed layer 451. This may be done by selectively masking seed layer 451 before the above removal step. Of course, traces 50 may also be formed by conventional steps applied to substrate 412 before depositing seed layer 451 at block 702.

At block 718 of flow diagram 700, shown in FIG. 8B, each fillet 22 is reflowed around the peripheral edge of its corresponding base pedestal 21 such that it contacts the corresponding pedestal 21 and layer 451, which is patterned at a later step to define the corresponding pad 20. Also in a later step, each post 14 is formed such that the peripheral edge 19 at its bottom end 17 contacts a corresponding, reflowed fillet 22. The reflow of fillet 22 is preferably done by exposing substrate 412 and fillets 22 to an elevated temperature for a suitable amount of time. In one embodiment of the present invention, the elevated temperature is approximately 30° C. above the melting point of the material of fillet 22 for a time duration of approximately three (3) minutes. The shape and location of the reflowed fillets 22 is shown in at a diagram 722A in FIG. 8B-3.

As can be seen in diagram 722A, fillet 22 contacts the outer peripheral portion of the top surface of pedestal 21, and contacts a corner 23 formed between the peripheral side of pedestal 21 and layer 451, portions of which will form base pad 20. In a preferred embodiment, fillet 22 does not contact the interior portion of the top surface of pedestal 21. This is because of the relatively small volume of material of fillet 22 and because surface tension forces in the material of fillet 22 near corner 23 draw fillet 22 towards corner 23 and away from the top interior surface of pedestal 21 during the reflow process. These same surface tension forces also compensate for any misalignment of fillet 22 in blocks 712–714 that may occur by causing the placement of fillet 22 to be centered around corner 23, i.e., symmetrically disposed about pedestal 21. These surface tension forces, by nature, seek a minimum surface area condition for fillet 22 which occurs with a symmetrical placement of fillet 22 around base pedestal 21.

At block 720, a spacer layer 460 of, preferably, polyimide is deposited on substrate surface 413. Polyimide spacer layer 460 is "spun" on, and then cured at an elevated temperature, as is known in the art. Layer 460 is used in a later step to form posts 14. At block 722, a mask layer 462 of aluminum is deposited on layer 460, for example by sputtering. Mask layer 462 provides a means for masking polyimide spacer layer 460 during a later etching process, discussed below in greater detail. Other materials which are more resistant to etching than the material of spacer layer 460 may be used instead of aluminum for layer 462. A partial cross-sectional view of substrate 412, layers 460 and 462, and reflowed fillets 22 at the end of the steps of blocks 718–722 is shown at diagram 722A in FIG. 8B-3.

At block 724, mask layer 462 is patterned such that portions of the aluminum may be removed from those locations where posts 14 are to be formed, which are designated as post locations 464. This preferably comprises the steps of depositing a photoresist layer over mask layer 462, exposing the photoresist layer to UV light, developing the photoresist such that polymerized photoresist overlies layer 462 in those locations where posts are not to be formed. Next, mask layer 462 is exposed to an aluminum wet etch, for example a buffered hydrochloric acid (HCl) solution, which removes portions of the aluminum overlying those locations where posts 14 are to be formed, i.e., locations 464. A partial cross-sectional view of substrate 412, etched layer 462, and locations 464 at the end of these steps is shown at a diagram 724A in FIG. 8B-4. This exposes the spacer layer 460 which overlies the areas of base pedestals 21 (and pads 20) where the posts 14 are to be formed.

At block 726, portions of spacer layer 460 underlying post locations 464 are removed. This may be done by reactive ion etching, other plasma etching processes, or wet etching processes. These portions of layer 460 are removed to expose respective areas of base pedestals 21 upon which respective posts 14 are to be built. An etch process is selected such that relatively little aluminum (layer 462) is removed. Bottom ends 17 of posts 14 are to be mounted at these exposed areas of base pedestals 21. In one embodiment, reactive ion etching is used as the etch process. Aluminum is more resistant to reactive ion etching than most polyimide materials (spacer layer 460). At block 728, the mask layer 462 (aluminum) is removed, or stripped, by a suitable chemical stripper. In one embodiment, a buffer solution of hydrochloric acid (HCl) is used as a chemical stripper. A partial cross-sectional view of substrate 412 and the etched portions of spacer layer 460 at the end of these steps is shown at a diagram 728A in FIG. 8C-1.

The removed portions of spacer layer 460 are commonly referred to as vias. The longitudinal cross-section shape of each via is roughly trapezoidal. Preferably, the etching of spacer layer 460 exposes the inner surface of each reflowed fillet 22, next to where the corresponding post 14 is to be formed. This allows post 14 to contact fillet 22 when post 14 is formed in a subsequent step. It may be appreciated that, as an alternative embodiment, spacer layer 460 may comprise a photo-imageable polyimide material which may be patterned and developed in a manner similar to that of a photoresist. In such a case, the deposition, pattering, and stripping of mask layer 462 as described in blocks 722, 724, and 728 may be eliminated. In lieu of these steps, the vias would be directly patterned in spacer layer 460 by exposure to a suitable light source through a suitable mask, and the exposed portions would be developed by a suitable chemical developer.

At block 730, a conductive material, preferably copper, is deposited on the exposed areas of pedestal 21. This may be done by electroless plating or electrolytic plating of substrate surface 413. The copper material is only deposited on the exposed surface of each base pedestal 21 and is not deposited on the top of spacer layer 460. In this regard, spacer layer 460 also functions as a plating mask. The copper material builds up from each base pedestal 21 in the corresponding via thereby forming the interior portion 24 of each post 14. Each post 14 builds up around its corresponding fillet 22, making contact to the fillet at its peripheral edge 19. A partial cross-sectional view of substrate 412 and of posts 14 at the end of this step is shown at a diagram 730A in FIG. 8C-2. It may be appreciated that this step comprises the step of depositing a conductive material on the exposed portions of base pedestal 21 such that a conductive post 14 is formed on the substrate surface 413 and mounted to pedestal 21, which is in turn mounted to base pad 20 (layer 451).

At block 732, spacer layer 460 is removed by stripping the polyimide material. A partial cross-sectional view of substrate 412, base pads 20, and posts 14 at the end of these steps is shown at a diagram 732A in FIG. 8C-3. At block 736, a thin coating layer 25 of nickel is plated on the exposed portions of posts 14, preferably by electroless plating. Layer 25 may be as thin as one micron or less. A suitable chemical catalyst may be added to the plating solution to deter the plating of nickel onto fillets 22. Also, in the case where post 14 comprises copper, a thin nickel "flash" layer may be initially coated onto post 14 and not onto fillet 22 by a first plating bath, and then a thicker coat of nickel may be plated by an auto-catalytic plating bath (i.e., nickel onto nickel only). Such catalysts and plating baths are well known to those of ordinary skill in the plating art and a detailed discussion thereof is not necessary to understand the present invention and to enable one of ordinary skill to make and use the same. A partial cross-sectional view of substrate 412, posts 14, and layer 25 at the end of this step is shown at a diagram 736A in FIG. 8C-4. Nickel layer 25 may be oxidized in the manner described above with reference to interconnect column 15 (FIGS. 1–5) to provide a solder dam means. Also, a thin layer of gold may plated on nickel layer 25 to protect post 14 from environmental corrosion and attack. Flow diagram 700 ends at block 738.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A wire interconnect structure for electrically coupling a substrate to an integrated circuit chip, comprising:
   an electrically conductive post disposed on a surface of said substrate for making contact to the integrated circuit, said post comprising an elongated body having a bottom end and top end thereof, the bottom end being mounted on the surface of the substrate and the top end for connecting to the integrated circuit chip by an electrical-conductive, reflowable material, said post comprising a material having a higher melting point than the reflowable material such that when the post is connected to the integrated circuit the shape of said post does not substantially change;
   a peripheral edge formed around said bottom end next to said surface; and
   a solder fillet disposed along said peripheral edge.

2. The wire interconnect structure of claim 1 wherein the top end of said post has a substantially flat surface which is substantially co-planer with the surface of the substrate.

3. The wire interconnect structure of claim 1 wherein said post body is tapered such that the bottom end is smaller than the top end.

4. The wire interconnect structure of claim 1 wherein said structure further comprises a base pad disposed between the substrate surface and the bottom end of said post, and wherein said solder fillet is disposed next to said base pad and along said peripheral edge.

5. The wire interconnect structure of claim 1 wherein the body of said post is substantially circular in a cross-section plane co-planer with its top end surface, the cross-section of said body being substantially circular throughout the body's direction of elongation, each of the top and bottom ends of said post being substantially circular, and wherein the ratio of the post's length in the direction of elongation to the diameter of circular cross-section at its bottom end is greater than approximately 3.5.

6. The wire interconnect structure of claim 5 wherein said ratio is at least substantially 6.0.

7. The wire interconnect structure of claim 1 wherein said post comprises an inner portion of a first electrically conductive material and an outer coating layer of a second conductive material disposed on said inner portion.

8. The wire interconnect structure of claim 7 wherein said first conductive material comprises copper and wherein said second conductive material comprises nickel.

9. The wire interconnect structure of claim 1 further comprising an oxide layer on the body of said post extending in the direction of elongation from the bottom end of said post to a point intermediate between the bottom and top ends of said post.

10. The wire interconnect structure of claim 1 wherein said structure is physically coupled and electrically coupled to a corresponding pad on an integrated circuit chip by a bump comprising an electrically conductive polymer material.

11. The wire interconnect structure of claim 10 wherein said electrically conductive polymer material comprises one of a conductive elastomer, a metal-filled thermoplastic, a metal-filled epoxy resin, a silver-filled epoxy resin, a metal-filled polyimide, a metal filled epoxy-polyimide, a conductive silicone material, and a metal-coated compliant plastic sphere.

12. A wire interconnect structure for electrically coupling a major substrate to an integrated circuit chip, comprising:
   an interconnect substrate having a first surface and a second surface;
   a first electrically conductive post disposed on the first surface of said interconnect substrate for making contact to one of the integrated circuit and the major substrate, said first post comprising an elongated body having a bottom end and top end thereof, the bottom end being mounted to the first surface of said interconnect substrate, the top end for connecting to one of the chip and major substrate by an electrically-conductive, reflowable material, said time post comprising a material having a higher melting point than the reflowable material such that the shape of said first post does not substantially change when the first post is connected;
   a second electrically conductive post disposed on the second surface of said interconnect substrate for making contact to the other of the integrated circuit and the major substrate, said second post comprising an elongated body having a bottom end and top end thereof, the bottom end being mounted to the second surface of said interconnect substrate, the top end for coupling to the other of the chip and major substrate by an electrically conductive, reflowable material said second post comprising a material having a higher melting point than the reflowable material such that the shape of said second post does not substantially change when the second post is connected; and
   coupling means on said interconnect substrate for electrically coupling said first post to said second post.

13. The wire interconnect structure of claim 12 wherein the top end of said conductive first post has a substantially flat surface which is substantially co-planer with the first surface of said interconnect substrate, and wherein the top end of said second conductive post has a substantially fiat surface which is substantially co-planer with the second surface of said interconnect substrate.

14. The wire interconnect structure of claim 12 wherein said first and second posts are disposed substantially opposite to one another.

15. The wire interconnect structure of claim 12 wherein said interconnect substrate further comprises a through hole between the first and second surfaces of said interconnect substrate and wherein said coupling means comprises a plug of conductive material disposed in said through hole.

16. The wire interconnect structure of claim 15 wherein said through hole has two opposite ends, each at a respective one of said first and second surfaces, and wherein said first and second posts are disposed substantially opposite to one another at respective opposite ends of said through hole.

17. The wire interconnect structure of claim 12 wherein the body of each said post is substantially circular in a cross-section plane co-planer with its top end surface, the cross-section of said body being substantially circular throughout the body's direction of elongation, each of the top and bottom ends of each said post being substantially circular, and wherein the ratio of each post's length in the direction of elongation to the diameter of circular cross-section at its bottom end is greater than approximately 3.5.

18. The wire interconnect structure of claim 17 wherein said ratio is at least substantially 6.0.

19. The wire interconnect structure of claim 12 wherein the bottom end of said first post is mounted to the first surface of said interconnect layer such that a peripheral edge is formed around said bottom end next to said first surface, and wherein said wire interconnect structure further comprises a solder fillet disposed along said peripheral edge.

20. The wire interconnect structure of claim 19, wherein said structure further comprises a base pad disposed between the first surface of said interconnect substrate and the bottom end of said first post, and wherein said solder fillet is disposed next to said base pad and along said peripheral edge.

21. The wire interconnect structure of claim 13 further comprising an oxide layer on the body of said first post extending in the direction of elongation from the bottom end of said first post to a point intermediate between the bottom and top ends of said first post.

22. The wire interconnect structure of claim 12 wherein the body of said first post is tapered such that the bottom end is smaller than the top end.

23. The wire interconnect structure of claim 12 further comprising a plurality of said first electrically conductive posts disposed on the first surface of said interconnect substrate, a plurality of said second electrically conductive posts disposed on the second surface of said interconnect substrate, and coupling means on said interconnect substrate for electrically coupling at least two of said first posts to corresponding ones of said second posts.

24. The wire interconnect structure of claim 12 wherein said first post is physically coupled and electrically coupled to said one of the integrated circuit and the major substrate by a bump comprising an electrically conductive polymer material.

25. The wire interconnect structure of claim 24 wherein said electrically conductive polymer material comprises one of a conductive elastomer, a metal-filled thermoplastic, a metal-filled epoxy resin, a silver-filled epoxy resin, a metal-filled polyimide, a metal filled epoxy-polyimide, a conductive silicone material, and a metal-coated compliant plastic sphere.

* * * * *

UNITED STATES PATENT AND TRADEMARK OFFICE
CERTIFICATE OF CORRECTION

PATENT NO. : 5,334,804

DATED : August 2, 1994

INVENTOR(S) : David G. Love, et al.

It is certified that error appears in the above-indentified patent and that said Letters Patent is hereby corrected as shown below:

Column 1, 8, delete "connoting" and insert --connecting--.

Column 1, 9, delete "supplying" and insert --supporting--.

Column 1, line 51, delete "sheafing" and insert --shearing--.

Column 6, line 62, after "70" insert --or--.

Column 10, line 9, delete "fight" and insert --right--.

Column 10, line 17, delete "fight" and insert --right--.

Column 10, line 18, after "at the" delete "fight" and insert --right--.

Column 10, line 18, after "bottom" delete "fight" and insert --right--.

Column 17, line 51, delete "of" and insert --is--.

Column 17, line 53, delete "is" and insert --of--.

Column 20, line 10, delete "comer" and insert --corner--.

UNITED STATES PATENT AND TRADEMARK OFFICE
CERTIFICATE OF CORRECTION

PATENT NO. : 5,334,804
DATED : August 2, 1994
INVENTOR(S) : David G. Love, et al.

It is certified that error appears in the above-indentified patent and that said Letters Patent is hereby corrected as shown below:

Column 22, line 12, delete "in".

Column 23, line 5, delete "comer" and insert --corner--.

Column 23, line 12, delete "comer" and insert --corner--.

Column 23, line 17, delete "comer" and insert --corner--.

Column 25, line 27, delete "electrical" and insert --electrically--.

Column 26, line 32, delete "time" and insert --first--.

Column 26, line 46, after "reflowable material" insert --,--.

Column 28, line 3, delete "13" and insert --12--.

Signed and Sealed this

Twelfth Day of November, 1996

Attest:

BRUCE LEHMAN

Attesting Officer  Commissioner of Patents and Trademarks